United States Patent
Fazan

(10) Patent No.: US 7,736,959 B2
(45) Date of Patent: Jun. 15, 2010

(54) INTEGRATED CIRCUIT DEVICE, AND METHOD OF FABRICATING SAME

(75) Inventor: Pierre Fazan, Lonay (CH)

(73) Assignee: Innovative Silicon ISi SA, Lausanne (CH)

( * ) Notice: Subject to any disclaimer, the term of this patent is extended or adjusted under 35 U.S.C. 154(b) by 26 days.

(21) Appl. No.: 12/069,704

(22) Filed: Feb. 12, 2008

(65) Prior Publication Data

US 2008/0153213 A1    Jun. 26, 2008

Related U.S. Application Data

(62) Division of application No. 10/884,481, filed on Jul. 2, 2004, now Pat. No. 7,335,934.

(60) Provisional application No. 60/489,266, filed on Jul. 22, 2003.

(51) Int. Cl.
H01L 21/8242    (2006.01)

(52) U.S. Cl. .................. 438/164; 438/149; 438/151; 438/157; 438/587; 438/307; 257/E21.66

(58) Field of Classification Search ............. 438/164, 438/307, 283
See application file for complete search history.

(56) References Cited

U.S. PATENT DOCUMENTS

| | | | |
|---|---|---|---|
| 3,439,214 A | 4/1969 | Kabell | |
| 3,997,799 A | 12/1976 | Baker | |
| 4,032,947 A | 6/1977 | Kesel et al. | |
| 4,250,569 A | 2/1981 | Sasaki et al. | |
| 4,262,340 A | 4/1981 | Sasaki et al. | |
| 4,298,962 A | 11/1981 | Hamano et al. | |
| 4,371,955 A | 2/1983 | Sasaki | |
| 4,527,181 A | 7/1985 | Sasaki | |
| 4,630,089 A | 12/1986 | Sasaki et al. | |
| 4,791,610 A | 12/1988 | Takemae | |

(Continued)

FOREIGN PATENT DOCUMENTS

EP    0 030 856    6/1981

(Continued)

OTHER PUBLICATIONS

"A Capacitorless Double-Gate DRAM Cell". Kuo et al., IEEE Electron Device Letters, vol. 23, No. 6, Jun. 2002, pp. 345-347.

(Continued)

*Primary Examiner*—Kenneth A Parker
*Assistant Examiner*—Jose R Diaz
(74) *Attorney, Agent, or Firm*—Neil A. Steinberg

(57) ABSTRACT

There are many inventions described and illustrated herein. In a first aspect, the present invention is directed to integrated circuit device including SOI logic transistors and SOI memory transistors, and method for fabricating such a device. In one embodiment, integrated circuit device includes memory portion having, for example, PD or FD SOI memory cells, and logic portion having, for example, high performance transistors, such as Fin-FET, multiple gate transistors, and/or non-high performance transistors (such as single gate transistors that do not possess the performance characteristics of the high performance transistors). In another aspect, the present invention is directed to a method of manufacture of such integrated circuit device.

17 Claims, 22 Drawing Sheets

U.S. PATENT DOCUMENTS

| | | |
|---|---|---|
| 4,979,014 A | 12/1990 | Hieda et al. |
| 5,144,390 A | 9/1992 | Matloubian |
| 5,258,635 A | 11/1993 | Nitayama et al. |
| 5,350,938 A | 9/1994 | Matsukawa et al. |
| 5,355,330 A | 10/1994 | Hisamoto et al. |
| 5,388,068 A | 2/1995 | Ghoshal et al. |
| 5,446,299 A | 8/1995 | Acovic et al. |
| 5,448,513 A | 9/1995 | Hu et al. |
| 5,466,625 A | 11/1995 | Hsieh et al. |
| 5,489,792 A | 2/1996 | Hu et al. |
| 5,528,062 A | 6/1996 | Hsieh et al. |
| 5,568,356 A | 10/1996 | Schwartz |
| 5,593,912 A | 1/1997 | Rajeevakumar |
| 5,606,188 A | 2/1997 | Bronner et al. |
| 5,627,092 A | 5/1997 | Alsmeier et al. |
| 5,631,186 A | 5/1997 | Park et al. |
| 5,696,718 A | 12/1997 | Hartmann |
| 5,740,099 A | 4/1998 | Tanigawa |
| 5,778,243 A | 7/1998 | Aipperspach et al. |
| 5,780,906 A | 7/1998 | Wu et al. |
| 5,784,311 A | 7/1998 | Assaderaghi et al. |
| 5,811,283 A | 9/1998 | Sun |
| 5,877,978 A | 3/1999 | Morishita et al. |
| 5,886,376 A | 3/1999 | Acovic et al. |
| 5,886,385 A | 3/1999 | Arisumi et al. |
| 5,897,351 A | 4/1999 | Forbes |
| 5,929,479 A | 7/1999 | Oyama |
| 5,930,648 A | 7/1999 | Yang |
| 5,936,265 A | 8/1999 | Koga |
| 5,939,745 A | 8/1999 | Park et al. |
| 5,943,258 A | 8/1999 | Houston et al. |
| 5,943,581 A | 8/1999 | Lu et al. |
| 5,960,265 A | 9/1999 | Acovic et al. |
| 5,968,840 A | 10/1999 | Park et al. |
| 5,977,578 A | 11/1999 | Tang |
| 5,982,003 A | 11/1999 | Hu et al. |
| 6,018,172 A | 1/2000 | Hidada et al. |
| 6,081,443 A | 6/2000 | Morishita |
| 6,096,598 A | 8/2000 | Furukawa et al. |
| 6,097,056 A | 8/2000 | Hsu et al. |
| 6,111,778 A | 8/2000 | MacDonald et al. |
| 6,121,077 A | 9/2000 | Hu et al. |
| 6,157,216 A | 12/2000 | Lattimore et al. |
| 6,171,923 B1 | 1/2001 | Chi et al. |
| 6,177,300 B1 | 1/2001 | Houston et al. |
| 6,177,708 B1 | 1/2001 | Kuang et al. |
| 6,214,694 B1 | 4/2001 | Leobandung et al. |
| 6,225,158 B1 | 5/2001 | Furukawa et al. |
| 6,245,613 B1 | 6/2001 | Hsu et al. |
| 6,252,281 B1 | 6/2001 | Yamamoto et al. |
| 6,292,424 B1 | 9/2001 | Ohsawa |
| 6,297,090 B1 | 10/2001 | Kim |
| 6,300,649 B1 | 10/2001 | Hu et al. |
| 6,320,227 B1 | 11/2001 | Lee et al. |
| 6,333,222 B1 * | 12/2001 | Kitazawa et al. ............ 438/241 |
| 6,333,532 B1 | 12/2001 | Davari et al. |
| 6,350,653 B1 | 2/2002 | Adkisson et al. |
| 6,351,426 B1 | 2/2002 | Ohsawa |
| 6,359,802 B1 | 3/2002 | Lu et al. |
| 6,384,445 B1 | 5/2002 | Hidaka et al. |
| 6,391,658 B1 | 5/2002 | Gates et al. |
| 6,403,435 B1 | 6/2002 | Kang et al. |
| 6,424,011 B1 | 7/2002 | Assaderaghi et al. |
| 6,424,016 B1 | 7/2002 | Houston |
| 6,429,477 B1 | 8/2002 | Mandelman et al. |
| 6,432,768 B1 * | 8/2002 | Chien et al. ................. 438/241 |
| 6,440,872 B1 | 8/2002 | Mandelman et al. |
| 6,441,435 B1 | 8/2002 | Chan |
| 6,441,436 B1 | 8/2002 | Wu et al. |
| 6,466,511 B2 | 10/2002 | Fujita et al. |
| 6,492,211 B1 | 12/2002 | Divakaruni et al. |
| 6,518,105 B1 | 2/2003 | Yang et al. |
| 6,531,754 B1 | 3/2003 | Nagano et al. |
| 6,538,916 B2 | 3/2003 | Ohsawa |
| 6,544,837 B1 | 4/2003 | Divakaruni et al. |
| 6,548,848 B2 | 4/2003 | Horiguchi et al. |
| 6,549,450 B1 | 4/2003 | Hsu et al. |
| 6,552,398 B2 | 4/2003 | Hsu et al. |
| 6,556,477 B2 | 4/2003 | Hsu et al. |
| 6,566,177 B1 | 5/2003 | Radens et al. |
| 6,567,330 B2 | 5/2003 | Fujita et al. |
| 6,590,258 B2 | 7/2003 | Divakauni et al. |
| 6,590,259 B2 | 7/2003 | Adkisson et al. |
| 6,597,014 B1 * | 7/2003 | Yamazaki et al. ............ 257/59 |
| 6,597,034 B2 | 7/2003 | Yamazaki et al. |
| 6,608,345 B2 | 8/2003 | Kunikiyo et al. |
| 6,617,651 B2 | 9/2003 | Ohsawa |
| 6,621,725 B2 | 9/2003 | Ohsawa |
| 6,632,723 B2 | 10/2003 | Watanabe et al. |
| 6,650,565 B1 | 11/2003 | Ohsawa |
| 6,653,175 B1 | 11/2003 | Nemati et al. |
| 6,661,042 B2 | 12/2003 | Hsu |
| 6,771,546 B2 | 8/2004 | Ikehashi et al. |
| 6,809,381 B2 | 10/2004 | Yoshida |
| 6,858,478 B2 | 2/2005 | Chau et al. |
| 6,897,098 B2 | 5/2005 | Hareland et al. |
| 6,909,151 B2 | 6/2005 | Hareland et al. |
| 6,913,964 B2 | 7/2005 | Hsu |
| 6,914,295 B2 | 7/2005 | Chau et al. |
| 7,061,050 B2 | 6/2006 | Fazan et al. |
| 7,335,934 B2 | 2/2008 | Fazan |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2002/0195637 A1 * | 12/2002 | Kokubun .................... 257/301 |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0057487 A1 | 3/2003 | Yamada et al. |
| 2003/0057490 A1 | 3/2003 | Nagano et al. |
| 2003/0085424 A1 | 5/2003 | Bryant et al. |
| 2003/0102497 A1 | 6/2003 | Fried et al. |
| 2003/0102518 A1 | 6/2003 | Fried et al. |
| 2003/0112659 A1 | 6/2003 | Ohsawa |
| 2003/0123279 A1 | 7/2003 | Aipperspach et al. |
| 2003/0146488 A1 | 8/2003 | Nagano et al. |
| 2003/0151112 A1 | 8/2003 | Yamada et al. |
| 2003/0168677 A1 | 9/2003 | Hsu |
| 2003/0197194 A1 | 10/2003 | Fried et al. |
| 2003/0213994 A1 | 11/2003 | Hayashi et al. |
| 2004/0021137 A1 | 2/2004 | Fazan et al. |
| 2004/0238890 A1 | 12/2004 | Fazan et al. |
| 2004/0240306 A1 | 12/2004 | Fazan et al. |
| 2005/0001269 A1 | 1/2005 | Hayashi et al. |
| 2005/0062088 A1 | 3/2005 | Houston |
| 2005/0064659 A1 | 3/2005 | Willer |
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |

| | | | |
|---|---|---|---|
| 2005/0189576 A1 | 9/2005 | Ohsawa | |
| 2005/0224878 A1 | 10/2005 | Chang | |

FOREIGN PATENT DOCUMENTS

| | | |
|---|---|---|
| EP | 0 350 057 B1 | 1/1990 |
| EP | 0 354 348 A2 | 2/1990 |
| EP | 0 202 515 B1 | 3/1991 |
| EP | 0 207 819 B1 | 8/1991 |
| EP | 0 175 378 B1 | 11/1991 |
| EP | 0 253 631 B1 | 4/1992 |
| EP | 0 513 923 | 11/1992 |
| EP | 0 300 157 B1 | 5/1993 |
| EP | 0 564 204 A2 | 10/1993 |
| EP | 0 579 566 A2 | 1/1994 |
| EP | 0 362 961 | 2/1994 |
| EP | 0 599 506 A1 | 6/1994 |
| EP | 0 359 551 B1 | 12/1994 |
| EP | 0 366 882 B1 | 5/1995 |
| EP | 0 465 961 B1 | 8/1995 |
| EP | 0 694 977 | 1/1996 |
| EP | 0 333 426 B1 | 7/1996 |
| EP | 0 727 820 A1 | 8/1996 |
| EP | 0 245 515 B1 | 4/1997 |
| EP | 0 788 165 A2 | 8/1997 |
| EP | 0 801 427 | 10/1997 |
| EP | 0 510 607 B1 | 2/1998 |
| EP | 0 537 677 B1 | 8/1998 |
| EP | 0 858 109 A2 | 8/1998 |
| EP | 0 860 878 A2 | 8/1998 |
| EP | 0 739 097 A2 | 10/1998 |
| EP | 0 869 511 A2 | 10/1998 |
| EP | 0 878 804 | 11/1998 |
| EP | 0 920 059 A2 | 6/1999 |
| EP | 0 924 768 A2 | 6/1999 |
| EP | 0 642 173 B1 | 7/1999 |
| EP | 0 727 822 B1 | 8/1999 |
| EP | 0 933 820 A1 | 8/1999 |
| EP | 0 951 072 A1 | 10/1999 |
| EP | 0 971 360 A1 | 1/2000 |
| EP | 0 980 101 A2 | 2/2000 |
| EP | 0 601 590 B1 | 4/2000 |
| EP | 0 993 037 A2 | 4/2000 |
| EP | 0 836 194 B1 | 5/2000 |
| EP | 0 599 388 B1 | 8/2000 |
| EP | 0 689 252 B1 | 8/2000 |
| EP | 0 606 758 B1 | 9/2000 |
| EP | 0 682 370 B1 | 9/2000 |
| EP | 1 073 121 A2 | 1/2001 |
| EP | 0 726 601 B1 | 9/2001 |
| EP | 0 731 972 | 11/2001 |
| EP | 1 162 663 A2 | 12/2001 |
| EP | 1 162 744 A1 | 12/2001 |
| EP | 1 179 850 A2 | 2/2002 |
| EP | 1 180 799 | 2/2002 |
| EP | 1 191 596 A2 | 3/2002 |
| EP | 1 204 146 A1 | 5/2002 |
| EP | 1 204 147 A1 | 5/2002 |
| EP | 1 209 747 A2 | 5/2002 |
| EP | 0 744 772 B1 | 8/2002 |
| EP | 1 233 454 A2 | 8/2002 |
| EP | 0 725 402 B1 | 9/2002 |
| EP | 1 237 193 | 9/2002 |
| EP | 1 241 708 A2 | 9/2002 |
| EP | 1 253 634 A2 | 10/2002 |
| EP | 0 844 671 B1 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | S62-007149 A | 1/1987 |
| JP | 62-272561 | 11/1987 |
| JP | 02-294076 | 2/1991 |
| JP | 3-171768 | 7/1991 |
| JP | H04-176163 A | 6/1992 |
| JP | H08-213624 A | 8/1996 |
| JP | 8-274277 | 10/1996 |
| JP | H08-316337 A | 11/1996 |
| JP | 9-046688 | 2/1997 |
| JP | 9-82912 | 3/1997 |
| JP | 8-213624 | 8/1998 |
| JP | 10-242470 | 9/1998 |
| JP | 11-87649 | 3/1999 |
| JP | 2000-247735 | 8/2000 |
| JP | 2000-274221 | 9/2000 |
| JP | 2000-389106 | 12/2000 |
| JP | 2001-180633 | 6/2001 |
| JP | 2002-009081 | 1/2002 |
| JP | 2002-083945 | 3/2002 |
| JP | 2002-094027 | 3/2002 |
| JP | 2002-94027 | 3/2002 |
| JP | 2002-176154 | 6/2002 |
| JP | 2002-246571 | 8/2002 |
| JP | 2002-009081 | 11/2002 |
| JP | 2002-329795 | 11/2002 |
| JP | 2002-343886 | 11/2002 |
| JP | 2002-353080 | 12/2002 |
| JP | 2003-31693 | 1/2003 |
| JP | 2003-031693 | 1/2003 |
| JP | 2003-68877 A | 3/2003 |
| JP | 2003-086712 | 3/2003 |
| JP | 2003-86712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |
| WO | WO 02/103703 | 12/2002 |
| WO | WO 03/096390 | 11/2003 |
| WO | WO 2004/023519 | 3/2004 |
| WO | WO 2004/038770 | 5/2004 |

OTHER PUBLICATIONS

"A Capacitorless Double-Gate DRAM Cell for High Density Applications", Kuo et al., IEEE IEDM, 2002, pp. 843-946.

"The Multi-Stable Behaviour of SOI-NMOS Transistors at Low Temperatures". Tack et al., Proc. 1988 SOS/SOI Technology Workshop (Sea Palms Resort, St. Simons Island, GA, Oct. 1988), p. 78.

"The Multistable Charge-Controlled Memory Effect in SOI MOS Transistors at Low Temperatures", Tack et al., IEEE Transactions on Electron Devices, vol. 37. No. 5, May 1990, pp. 1373-1382.

"Mechanisums of Charge Modulation in the Floating Body of Triple-Well nMOSFET Capacitor-less DRAMs", Villaret et al., Proceedings of the INFOS 2003, Insulating Films on Semiconductors, 13th Bi-annual Conference, Jun. 18-20, 2003, Barcelona (Spain), (4 pages).

"A Memory Using One-Transistor Gain Cell on SOI (FBC) with Performance Suitable for Embedded DRAM's", Ohsawa et al., 2003 Symposium on VLSI Circuits Digest of Technical Papers, Jun. 2003 (4 pages).

FBC (Floating Body Cell) for Embedded DRAM on SOI, Inoh et al., 2003 Symposium on VLSI Circuits Digest of Technical Papers, Jun. 2003 (2 pages).

"Toshiba's DRAM Cell Piggybacks on SOI Wafer", Y. Hara, EE Times, Jun. 2003.

"Memory Design Using a One-Transistor Gain Cell on SOI", Ohsawa et al., IEEE Journal of Solid-State Circuits, vol. 37, No. 11, Nov. 2002, pp. 1510-1522.

"Opposite Side Floating Gate SOI Flash Memory Cell", Lin et al., IEEE, Mar. 2000. pp. 12-15.

"Advanced TFT SRAM Cell Technology Using a Phase-Shift Lithography", Yamanaka at al., IEEE Transactions on Electron Devices, vol. 42, No. 7, Jul. 1995, pp. 1305-1313.

"Soft-Error Characteristics in Bipolar Memory Cells with Small Critical Charge", Idei et al., IEEE Transactions on Electron Devices, vol. 38, No. 11, Nov. 1991, pp. 2465-2471.

"An SOI 4 Transistors Self-Refresh Ultra-Low-Voltage Memory Cell", Thomas et al., IEEE, Mar. 2003, pp. 401-404.

"Design of a SOI Memory Cell", Stanojevie et al, IEEE Proc. 21$^{st}$ International Conference on Microelectronics (MIEL '97), vol. 1, NIS, Yugoslavia, Sep. 14-17, 1997, pp. 297-300.

"Effects of Floating Body on Double Polysilicon Partially Depleted SOI Nonvolatile Memory Cell", Chan et al., IEEE Electron Device Letters, vol. 24, No. 2, Feb. 2003, pp. 75-77.

"MOSFET Design Simplifies DRAM", P. Fazan, EE Times, May 14, 2002 (3 pages).

"One of Application of SOI Memory Cell—Memory Array", Lončar et al., IEEE Proc. 22$^{nd}$ International Conference on Microelectronics (MIEL 2000), vol. 2, NIS, Serbia, May 14-17, 2000, pp. 455-458.

"A SOI Current Memory for Analog Signal Processing at High Temperature", Portmann et al., 1999 IEEE International SOI Conference, Oct. 1999, pp. 18-19.

"Chip Level Reliability on SOI Embedded Memory", Kim et al., Proceedings 1998 IEEE International SOI Conference, Oct. 1998, pp. 135-139.

"Analysis of Floating-Body-Induced Leakage Current in 0.15μ m SOI DRAM", Terauchl et al., Proceedings 1996 IEEE International SOI Conference, Oct. 1996. pp. 138-139.

"Programming and Erase with Floating-Body for High Density Low Voltage Flash EEPROM Fabricated on SOI Wafers", Chi et al., Proceedings 1995 IEEE International SOI Conference, Oct. 1995, pp. 129-130.

"Measurement of Transient Effects in SOI DRAM/SRAM Access Transistors", A. Wei. IEEE Electron Device Letters, vol. 17, No. 5, May 1996, pp. 193-195.

"In-Depth Analysis of Opposite Channel Based Charge Injection in SOI MOSFETs and Related Defect Creation and Annihilation", Sinha et al., Elsevier Science, Microelectronic Engineering 28, 1995, pp. 383-386.

"Dynamic Effects in SOI MOSFET's", Giffard et al., IEEE, 1991, pp. 160-161.

"A Simple 1-Transistor Capacitor-Less Memory Cell for High Performance Embedded DRAMs", Fazan et al., IEEE 2002 Custom Integrated Circuits Conference, Jun. 2002, pp. 99-102.

"A Novel Pattern Transfer Process for Bonded SOI Giga-bit DRAMs", Lee et al., Proceedings 1996 IEEE International SOI Conference, Oct. 1996, pp. 114-115.

"An Experimental 2-bit/Cell Storage DRAM for Macrocell or Memory-on-Logic Application", Furuyama et al., IEEE Journal of Solid-State Circuits, vol. 24, No. 2, Apr. 1989, pp. 388-393.

"High-Performance Embedded SOI DRAM Architecture for the Low-Power Supply", Yamauchi at al., IEEE Journal of Solid-State Circuits, vol. 35, No. 8, Aug. 2000, pp. 1169-1178.

"An SOI-DRAM with Wide Operating Voltage Range by CMOS/SIMOX Technology", Suma et al., 1994 IEEE International Solid-State Circuits Conference, pp. 138-139.

"A Capacitorless DRAM Cell on SOI Substrate", Wann et al., IEEE IEDM, 1993, pp. 635-638.

"The Multistable Charge Controlled Memory Effect in SOI Transistors at Low Temperatures", Tack et al., IEEE Workshop on Low Temperature Electronics, Aug. 7-8, 1989, University of Vermont, Burlington, pp. 137-141.

"High-Endurance Ultra-Thin Tunnel Oxide in MONOS Device Structure for Dynamic Memory Application", Wann et al., IEEE Electron Device Letters, vol. 16, No. 11, Nov. 1995, pp. 491-493.

"Hot-Carrier Effects in Thin-Film Fully Depleted SOI MOSFET's", Ma et al., IEEE Electron Device Letters, vol. 15, No. 6, Jun. 1994, pp. 218-220.

"Design Analysis of Thin-Body Silicide Source/Drain Devices", 2001 IEEE International SOI Conference, Oct. 2001, pp. 21-22.

"SOI MOSFET on Low Cost SPIMOX Substrate", Iyer et al., IEEE IEDM, Sep. 1998, pp. 1001-1004.

"Simulation of Floating Body Effect in SOI Circuits Using BSIM3SOI", Tu et al., Proceedings of Technical Papers (IEEE Cat No. 97$^{TH}$ 8303), pp. 339-342.

"High-Field Transport of Inversion-Layer Electrons and Holes Including Velocity Overshoot", Assaderaghi et al., IEEE Transactions on Electron Devices, vol. 44. No. 4, Apr. 1997, pp. 664-671.

"Dynamic Threshold-Voltage MOSFET (DTMOS) for Ultra-Low Voltage VLSI", Assaderaghi et al., IEEE Transactions on Electron Devices, vol. 44, No. 3, Mar. 1997. pp. 414-422.

"Hot-Carrier-Induced Degradation in Ultra-Thin-Film Fully-Depleted SOI MOSFETs", Yu et al., Solid-State Electronics, vol. 39, No. 12, 1996, pp. 1791-1794.

Hot-Carrier Effect in Ultra-Thin-Film (UTF) Fully-Depleted SOI MOSFET's, Yu et al., 54$^{th}$ Annual Device Research Conference Digest (Cat. No. 96$^{TH}$8193), pp. 22-23.

"SOI MOSFET Design for All-Dimensional Scaling with Short Channel, Narrow Width and Ultra-thin Films", Chan et al., IEEE IEDM, 1995, pp. 631-634.

"A Novel Silicon-On-Insulator (SOI) MOSFET for Ultra Low Voltage Operation", Assaderaghi et al., 1994 IEEE Symposium on Low Power Electronics, pp. 58-59.

"Interface Characterization of Fully-Depleted SOI MOSFET by a Subthreshold I-V Method". Yu et al., Proceedings 1994 IEEE International SOI Conference, Oct. 1994, pp. 63-64.

"A Capacitorless Double-Gate DRAM Cell Design for High Density Applications", Kuo et al., IEEE IEDM, Feb. 2002, pp. 843-846.

"A Dynamic Threshold Voltage MOSFET (DTMOS) for Ultra-Low Voltage Operation", Assaderaghi et al., IEEE Electron Device Letters, vol. 15, No. 12, Dec. 1994, pp. 510-512.

"Dynamic Threshold-Voltage MOSFET (DTMOS) for Ultra-Low Voltage Operation", Assaderaghi et al., 1994 EEE, IEDM 94, pp. 809-812.

"A Capacitorless DRAM Cell on SOI Substrate", Wann et al., IEEE IEDM 1993, pp. 635-638.

"Studying the Impact of Gate Tunneling on Dynamic Behaviors of Partially-Depleted SOI CMOS Using BSIMPD", Su et al., IEEE Proceedings of the International Symposium on Quality Electronic Design (ISQED '02), Apr. 2002 (5 pages).

"Characterization of Front and Back Si-SiO$_2$ Interfaces in Thick- and Thin-Film Silicon-on-Insulator MOS Structures by the Charge-Pumping Technique", Wouters et al., IEEE Transactions on Electron Devices, vol. 38, No. 9, Sep. 1989, pp. 1746-1750.

"An Analytical Model for the Misis Structure in SOI MOS Devices", Tack et al., Solid-State Electronics vol. 33, No. 3. 1990, pp. 357-364.

"A Long Data Retention SOI DRAM with the Body Refresh Function", Tomishima et al., IEICE Trans. Electron., vol. E80-C, No. 7, Jul. 1997, pp. 899-904.

"A Simple 1-Transistor Capacitor-Less Memory Cell for High Performance Embedded DRAMs", Fazan et al., IEEE 2002 Custom Integrated Circuits Conference, Jun. 2002, pp. 99-102.

"High-Endurance Ultra-Thin Tunnel Oxide in MONOS Device Structure for Dynamic Memory Application", Wann et al., IEEE Electron Device Letters, vol. 18, No. 11, Nov. 1995, pp. 491-493.

"Capacitor-Less 1-Transistor DRAM", Fazan et al., 2002 IEEE International SOI Conference, Oct. 2002, pp. 10-13.

"SOI (Silicon-on-Insulator) for High Speed Ultra Large Scale Integration", C. Hu, Jpn. J. Appl. Phys. vol. 33 (1994) pp. 365-369, Part 1, No. 1B, Jan. 1994.

"Source-Bias Dependent Charge Accumulation in P+ -Poly Gate SOI Dynamic Random Access Memory Cell Transistors", Sim et al., Jpn. J. Appi. Phys. vol. 37 (1998) pp. 1260-1283, Part 1, No. 3B, Mar. 1998.

"Suppression of Parasitic Bipolar Action in Ultra-Thin-Film Fully-Depleted CMOS/SIMOX Devices by Ar-Ion Implantation into Source/Drain Regions", Ohno et al., IEEE Transactions on Electron Devices, vol. 45, No. 5, May 1998, pp. 1071-1076.

"Fully Isolated Lateral Bipolar-MOS Transistors Fabricated in Zone-Melting-Recrystallized Si Films on SiO$_2$,", Tsaur, et al., IEEE Electron Device Letters, vol. EDL-4, No. 8, Aug. 1983, pp. 269-271.

"Silicon-On-Insulator Bipolar Transistors", Rodder et al., IEEE Electron Device Letters, vol. EDL-4, No. 6, Jun. 1983, pp. 193-195.

"Characteristics and Three-Dimensional Integration of MOSFET's in Small-Grain LPCVD Polycrystalline Silicon", Malhi et al., IEEE Transactions on Electron Devices, vol. ED-32, No. 2, Feb. 1985, pp. 258-281.

"Triple-Wel nMOSFET Evaluated as a Capacitor-Less DRAM Cell for Nanoscale Low-Cost & High Density Applications", Villaret et al., Handout at Proceedings of 2003 Silicon Nanoelectronics Workshop, Jun. 8-9, 2003, Kyoto, Japan (2 pages).

"Mechanisms of Charge Modulation in the Floating Body of Triple-Well NMOSFET Capacitor-less DRAMs", Villaret et al., Handout at Proceedings of INFOS 2003, Jun. 18-20, 2003, Barcelona, Spain (2 pages).

"Embedded DRAM Process Technology", M. Yamawaki, Proceedings of the Symposium on Semiconductors and Integrated Circuits Technology, 1998, vol. 55, pp. 38-43.

"3-Dimensional Simulation of Turn-off Current in Partially Depleted SOI MOSFETs", Ikeda et al., IEIC Technical Report, Institute of Electronics, Information and Communication Engineers, 1998, vol. 97, No. 557 (SDM97 186-198), pp. 27-34.

"DRAM Design Using the Taper-Isolated Dynamic RAM Cell, Leiss et al.", IEEE Transactions on Electron Devices, vol. ED-29, No. 4, Apr. 1982, pp. 707-714.

"Scalability Study on a Capacitorless 1T-DRAM: From Single-gate PD-SOI to Double-gate FINDRAM", Tanaka et al., 2004 IEEE, 4 pages.

"A Design of a Capacitorless 1-T-DRAM Cell Using Gate-induced Drain Leakage (GIDL) Current for Low-Power and High-speed Embedded Memory", Yoshida et al., 2003 IEEE, 4 pages.

"A Study of High Scalable DG-FinDRAM", Yoshida et al., IEEE Electron Device Letters, vol. 26, No. 9, Sep. 2005, pp. 655-657.

"Novel Capacitorless 1T-DRAM From Single-gate PD-SOI to Double-gate FinDRAM", ATIP Scoops, May 9, 2005, 9 pages.

* cited by examiner

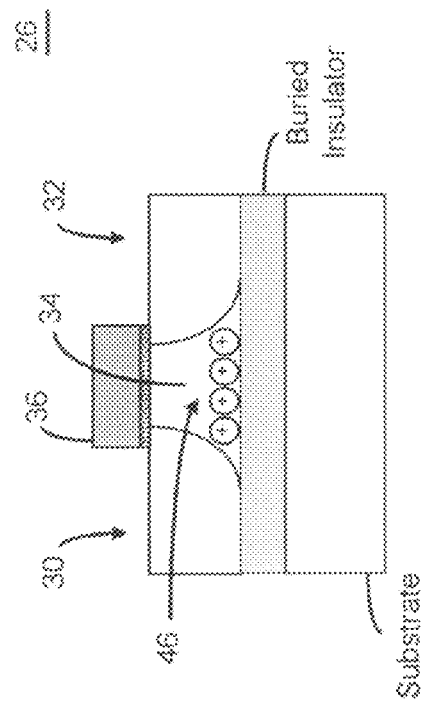
FIGURE 3B (PRIOR ART)
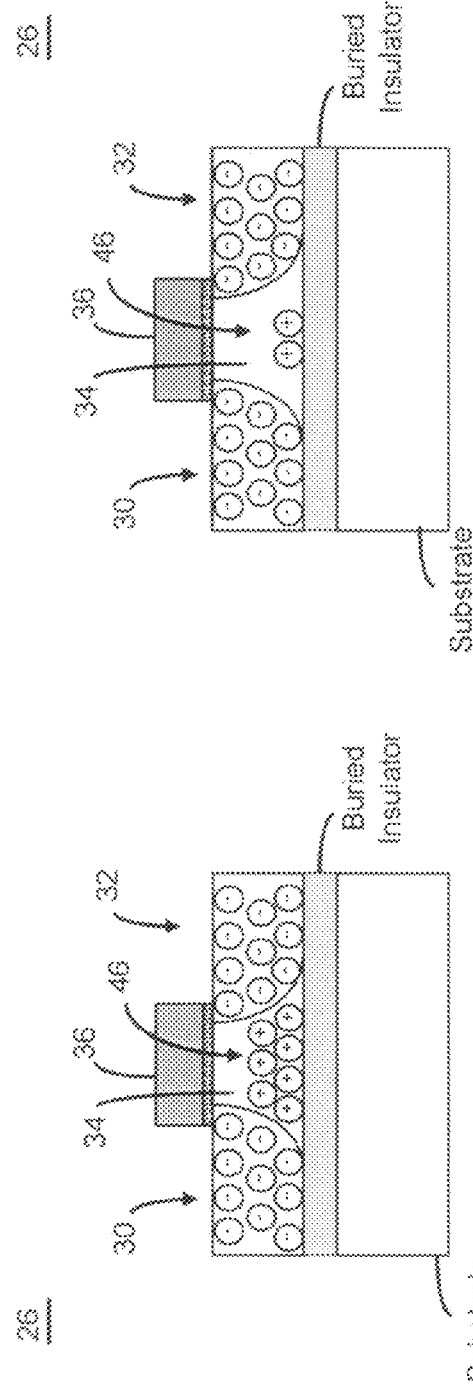
FIGURE 4A (PRIOR ART)
FIGURE 4B (PRIOR ART)

INTEGRATED CIRCUIT DEVICE, AND METHOD OF FABRICATING SAME

CROSS-REFERENCE TO RELATED APPLICATIONS

This application is a divisional application of application Ser. No. 10/884,481 (now U.S. Pat. No. 7,335,934), filed Jul 2, 2004. This application and the 481application claim priority to U.S. Provisional Application Serial No. 60/489,266, entitled "Integrated Circuit Device, and Method of Fabricating Same", filed Jul 22, 2003 (hereinafter "the Provisional Application"). The contents of the Provisional Application are incorporated by reference herein in their entirety.

BACKGROUND

This invention relates to a semiconductor devices, for example, high performance transistors, and architectures, and techniques for fabricating such devices and architectures; and more particularly, in one aspect, to a semiconductor device including a memory section (for example, transistors are dynamic random access memory cells ("DRAM") wherein such cells have an electrically floating body in which an electrical charge is stored) and a logic section (including, for example, high performance transistors and non-high performance transistors) fabricated and/or disposed on the same substrate (for example, the same semiconductor die).

There is a continuing trend to fabricate advanced integrated circuits using techniques, materials and devices that improve performance, reduce leakage current and enhance overall scaling. Silicon-on-Insulator (SOI) is a material in which such devices may be fabricated on or in (hereinafter collectively "on"). Such devices are known as SOI devices and include, for example, partially depleted (PD), fully depleted (FD) devices, multiple gate devices (for example, double or triple gate), fin-shaped field effect transistor ("Fin-FET"), or gate all around devices. SOI devices have demonstrated improved performance (for example, speed), reduced leakage current characteristics and considerable enhancement in scaling.

With reference to FIGS. 1A-1C, three dimensional and cross-sectional views of Fin-FET or multiple gate SOI transistor 10 tend to appear quite similar. Moreover, the fabrication and configuration of multiple gate SOI transistor 10 typically involves first defining (using conventional lithographic and etching techniques) an upper or top layer of silicon of SOI wafer 12 (typically having a thickness of 10 to 200 nm) to define segments or pieces 14 that constitute the active regions of transistor 10 (i.e., source 16, drain 18, and body 20). Thereafter, dielectric material is deposited or formed (for example, via oxidation) on silicon segments 12 to form gate dielectric 22. A gate material (for example, a highly conductive silicon-based material) is then deposited and patterned to form gate 24 of transistor 10 which, as illustrated in FIG. 1A, is disposed on, juxtaposed and/or "covers" a plurality of interfaces (in the illustrative embodiment, three) of silicon segments or pieces 14 of SOI transistor 10.

Notably, the cross sectional view of FIG. 1B is taken through the gate region and along the longitudinal axis of the gate region of FIG. 1A (along lines B-B') and, as such, the source and drain regions are not illustrated because they are in a direction perpendicular to that axis. Moreover, the cross-sectional view of FIG. 1C is taken through the source and drain regions and perpendicular to the longitudinal axis of the gate (along lines C-C').

An advantage of such structures is performance (for example, speed) because, in operation, a channel forms in the body adjacent or beneath each of the gate-body interfaces. In the illustrative embodiment of FIG. 1A, three channels may form: two channels may be vertical and one channel may be horizontal. As such, the overall current drive of SOI transistor 10 is higher thereby facilitating higher performance or speed.

Another aspect of such transistors is that certain characteristics of the transistor may be determined by selecting the width of the silicon segments or pieces 14. In this regard, the width of the silicon segments or pieces 14 may be selected or designed so that during operation the full body of transistor 10 is fully depleted or controlled completely by the voltage applied to gate 24.

Such transistors may be well suited for microprocessors, microcontrollers or the like (hereinafter collectively "microprocessors"). In the context of microprocessors, currently less than half of the die of a microprocessor is occupied by or contains advanced logic transistors. Memory cells (and peripheral circuitry) reside on the remaining area of the die.

With reference to FIGS. 2A-2C, memory cell 26 proposed for SOI materials may be based on, among other things, a floating body effect of SOI transistors. (See, for example, U.S. patent application Ser. No. 10/450,238, Fazan et al., filed Jun. 10, 2003 and entitled "Semiconductor Device" (hereinafter "Semiconductor Memory Device Patent Application"; the contents of which are incorporated by reference herein). In this regard, memory cell 26 may consist of a PD or a FD SOI transistor 28 having a channel (between source region 30 and drain region 32), which is disposed adjacent to body region 34 and separated therefrom by gate dielectric. The body region 34 is electrically floating. A gate 36 is employed (in conjunction with source region 30 and drain region 32, among other things) to control the operation of memory cell 26.

With reference to FIGS. 3A, 3B, 4A and 4B, in one embodiment, data is written into or read from a selected memory cell 26 by applying suitable control signals to a selected word line(s) 40, a selected source line(s) 42 and/or a selected bit line(s) 44. In response, majority charge carriers 46 are accumulated in or emitted and/or ejected from electrically floating body region 34 wherein the data states are defined by the amount of carriers within electrically floating body region 34. In one embodiment, memory cell 26 operates by accumulating in or emitting/ejecting majority carriers (electrons or holes) 46 from body region 34 of, for example, N-channel transistors. (See, FIGS. 4A and 4B). In this regard, accumulating majority carriers (in this example, "holes") 46 in body region 34 of transistors 28 via, for example, impact ionization near source region 30 and/or drain region 32, is representative of a logic high or "1" data state. (See, FIG. 4A). Emitting or ejecting majority carriers 46 from body region 34 via, for example, forward biasing the source/body junction and/or the drain/body junction, is representative of a logic low data state ("0"). (See, FIG. 4B).

Such memory cells, in addition to having low leakage current characteristics, facilitate implementing high-density memory cell arrays. While it may be advantageous to integrate SOI logic transistors and SOI memory cells on a single die to, among other things, reduce the overall dimensions of the die, fabricating an integrated device having SOI logic transistors and SOI memory cells may be challenging because each have unique and/or differing fabrication considerations. There is a need for a method of fabricating an integrated circuit device comprised of high performance SOI transistors (for example, Fin-FET and multiple gate structures) and SOI memory cells (for example, PD or FD SOI memory cells). Indeed, there is a need for a high performance integrated circuit device having SOI logic (including high performance and/or non-high performance transistors) and SOI memory that each include improved performance (for example, speed), reduced leakage current characteristics and/or considerable enhancement in scaling and density.

SUMMARY OF THE INVENTION

There are many inventions described and illustrated herein, including aspects and embodiments thereof. In a first principal aspect, the present invention is an integrated circuit device disposed in or on a semiconductor layer which resides on or above an insulating layer of a substrate, the semiconductor integrated circuit device comprises a memory section and a logic section. The memory section includes a plurality of memory cells wherein each memory cell includes a transistor having a source region, a drain region and a body region disposed between the source region and the drain region, wherein the body region is electrically floating. A gate is spaced apart from, and capacitively coupled to the body region.

Each memory cell includes a first data state and a second data state. The first data state is representative of a first charge in the body region wherein the first charge is substantially provided by accumulating majority carriers in the body region. The second data state representative of a second charge in the body region wherein the second charge is substantially provided by removing majority carriers from the body region.

The logic section including a plurality of transistors wherein each transistor includes a source region, a drain region and a body region disposed between the source region and the drain region, wherein the source, drain and body regions are disposed in a segment of the semiconductor layer such that the body region includes a plurality of surfaces. A gate is spaced apart from and opposing the plurality of surfaces of the body region.

In one embodiment, the source, drain and body regions of a plurality of transistors of the logic section are contained in a segment of the semiconductor layer. Further, the plurality of source, drain and body regions of the plurality of transistors of the logic section may be contained in a plurality of segments of the semiconductor layer. Indeed, each segment of the plurality of segments contains source, drain and body regions of a plurality of transistors of the logic section.

In another embodiment, the source, drain and body regions of the transistors of the memory cells are disposed in a segment of the semiconductor layer. In this embodiment, the body region of each transistor of each memory cell includes a plurality of surfaces and wherein the associated gate is spaced apart from and opposing the plurality of surfaces of the body region.

Notably, in one embodiment, the width of the gate of each transistor of the plurality of transistors of the logic section is less than the width of the gate of each transistor of each memory cell of the memory section.

In another aspect, the present invention is a method of manufacturing an integrated circuit device on an SOI wafer having a semiconductor layer disposed on an insulating layer. The integrated circuit device includes (1) a logic section, including a plurality of transistors, and (2) a memory section, including a plurality of memory cells wherein each memory cell consists essentially of one transistor.

The method of this aspect of the invention comprises forming a plurality of semiconductor pieces in the semiconductor layer of the SOI wafer associated with the logic section, wherein each piece includes a plurality of surfaces. The method also includes forming a memory section in the semiconductor layer of the SOI wafer. In this regard, the memory section includes a major surface.

A dielectric material may be deposited on (i) the plurality of surfaces of the semiconductor pieces and (ii) the major surface of the memory section. A conductive material may be deposited above the dielectric material and a plurality of gates and associated gate dielectrics may be formed from the conductive material and dielectric material. The method further includes providing source and drain regions in (i) the semiconductor pieces and (ii) the major surface of the memory section.

In one embodiment, the source and drain regions of the transistors in the memory section are formed in the major surface of the memory section via ion implantation. The source and drain regions of the transistors in the logic section may also be formed in the semiconductor pieces via ion implantation.

In another embodiment, the width of the gates of each transistor of the plurality of transistors of the logic section is less than the width of the gate of each transistor of each memory cell of the memory section.

In another aspect, the present invention is a method of manufacturing an integrated circuit device on an SOI wafer having a semiconductor layer disposed on an insulating layer. The integrated circuit device includes (1) a logic section, including a plurality of transistors, and (2) a memory section, including a plurality of memory cells wherein each memory cell consists essentially of one transistor. The method of this aspect of the present invention includes forming a plurality of semiconductor pieces in the semiconductor layer of the SOI wafer associated with the logic section and the memory section, wherein each semiconductor piece includes a plurality of surfaces.

The method further includes depositing a dielectric material on the plurality of surfaces of the semiconductor pieces of the SOI wafer associated with the memory and logic sections. A conductive material may be deposited above the dielectric material, and a plurality of gates and associated gate dielectrics may be formed from the conductive material and the dielectric material. The source and drain regions may be formed in the semiconductor pieces of the SOI wafer associated with the memory and logic sections.

In one embodiment, the source and drain regions of the transistors in the memory section are formed in the semiconductor pieces of the SOI wafer associated with the memory section via ion implantation. The source and drain regions of the transistors in the logic section may also be formed in the semiconductor pieces of the SOI wafer associated with the logic section via ion implantation.

In another embodiment, the width of the gates of each transistor of the plurality of transistors of the logic section is less than the width of the gate of each transistor of each memory cell of the memory section.

Again, there are many inventions described and illustrated herein. This Summary of the Invention is not exhaustive of the scope of the present invention. Moreover, this Summary is not intended to be limiting of the invention and should not be interpreted in that manner. While certain embodiments, features, attributes and advantages of the inventions have been described in this Summary, it should be understood that many others, as well as different and/or similar embodiments, features, attributes and/or advantages of the present inventions, which are apparent from the description, illustrations and claims, which follow.

BRIEF DESCRIPTION OF THE DRAWINGS

In the course of the detailed description to follow, reference will be made to the attached drawings. These drawings show different aspects of the present invention and, where appropriate, reference numerals illustrating like structures, components, materials and/or elements in different figures are labeled similarly. It is understood that various combinations of the structures, components, materials and/or elements, other than those specifically shown, are contemplated and are within the scope of the present invention.

FIG. 3B illustrates a memory cell according to one embodiment of the Semiconductor Memory Device Patent Application;

FIGS. 4A and 4B are exemplary schematic illustrations of the charge relationship, for a particular memory state, of the floating body, source and drain regions of a memory cell according to one embodiment of the Semiconductor Memory Device Patent Application;

DETAILED DESCRIPTION OF THE INVENTION

There are many inventions described and illustrated herein as well as many aspects and embodiments of those inventions. In a first aspect, the present invention is directed to integrated circuit device including SOI logic transistors and SOI memory transistors, and method for fabricating such a device. With reference to FIG. 5, in one embodiment, integrated circuit device 100 includes memory section 102 having, for example, PD or FD SOI memory cells 104a-d, and logic section 106 having, for example, high performance transistors 108a-c, such as Fin-FET, multiple gate transistors, and/or non-high performance transistors (for example, single gate transistors that do not possess the performance characteristics of high performance transistors—not illustrated).

Figure 6:
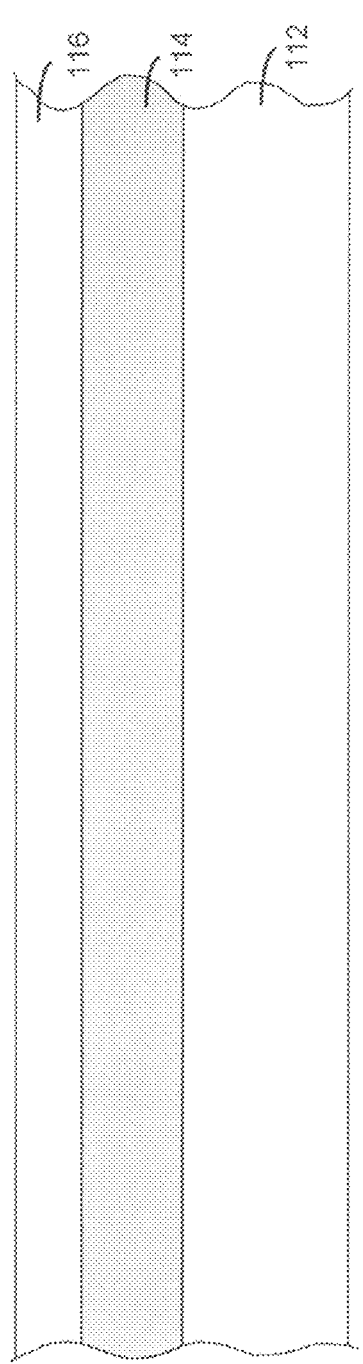
FIGS. 6-10 and 11A illustrate cross-sectional views of the fabrication of the integrated circuit of FIG. 5A at various stages of an exemplary process, according to certain aspects of the present invention.

With reference to FIG. 6, an exemplary method of fabricating or manufacturing an integrated circuit 100 according to one aspect of the present invention may begin with SOI wafer 110 including substrate 112 (comprised of, for example, a semiconductor material (for example, silicon) or a glass-like or insulator-like material) and insulator 114 (comprised of, for example, silicon oxide or silicon nitride, or combinations thereof) disposed thereon. In addition, the SOI wafer includes semiconductor layer 116 (comprised of, for example, silicon or germanium, or combinations thereof) disposed on insulator 114. Notably, memory and logic sections 102 and 106, respectively, of integrated circuit device 100 may be formed in or on semiconductor layer 116.

Figure 7:
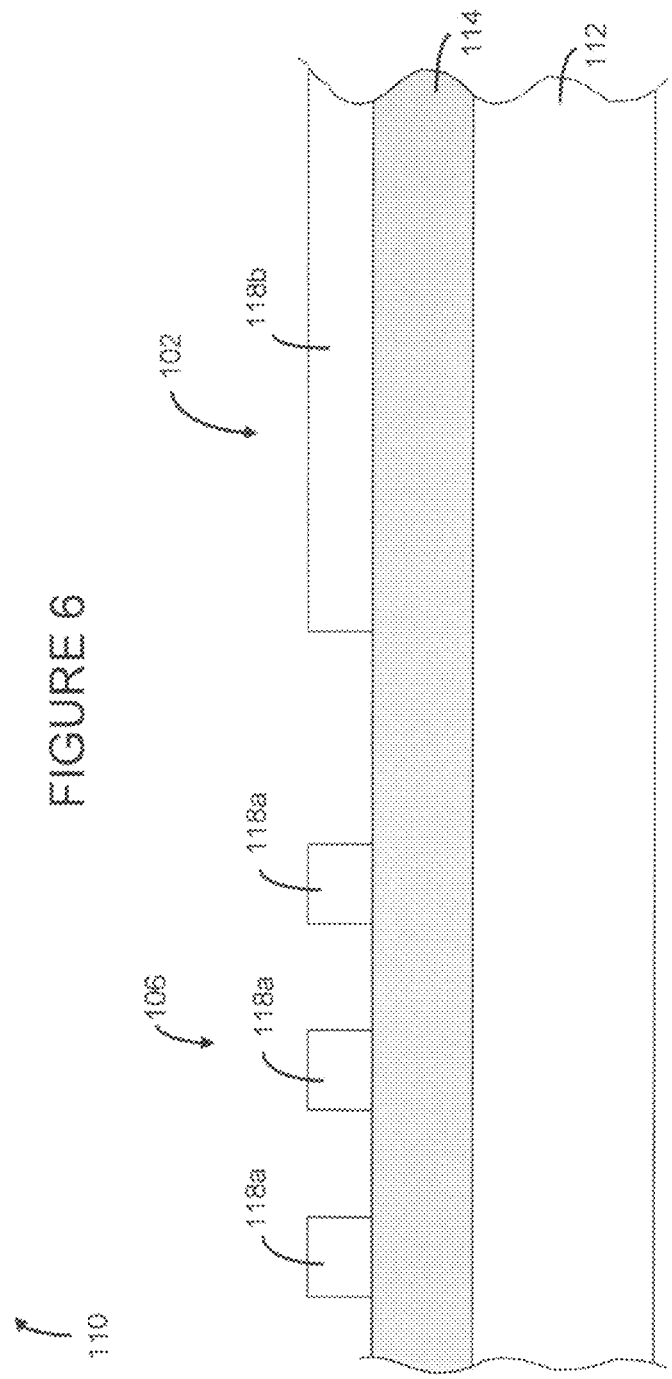
Figure 8:
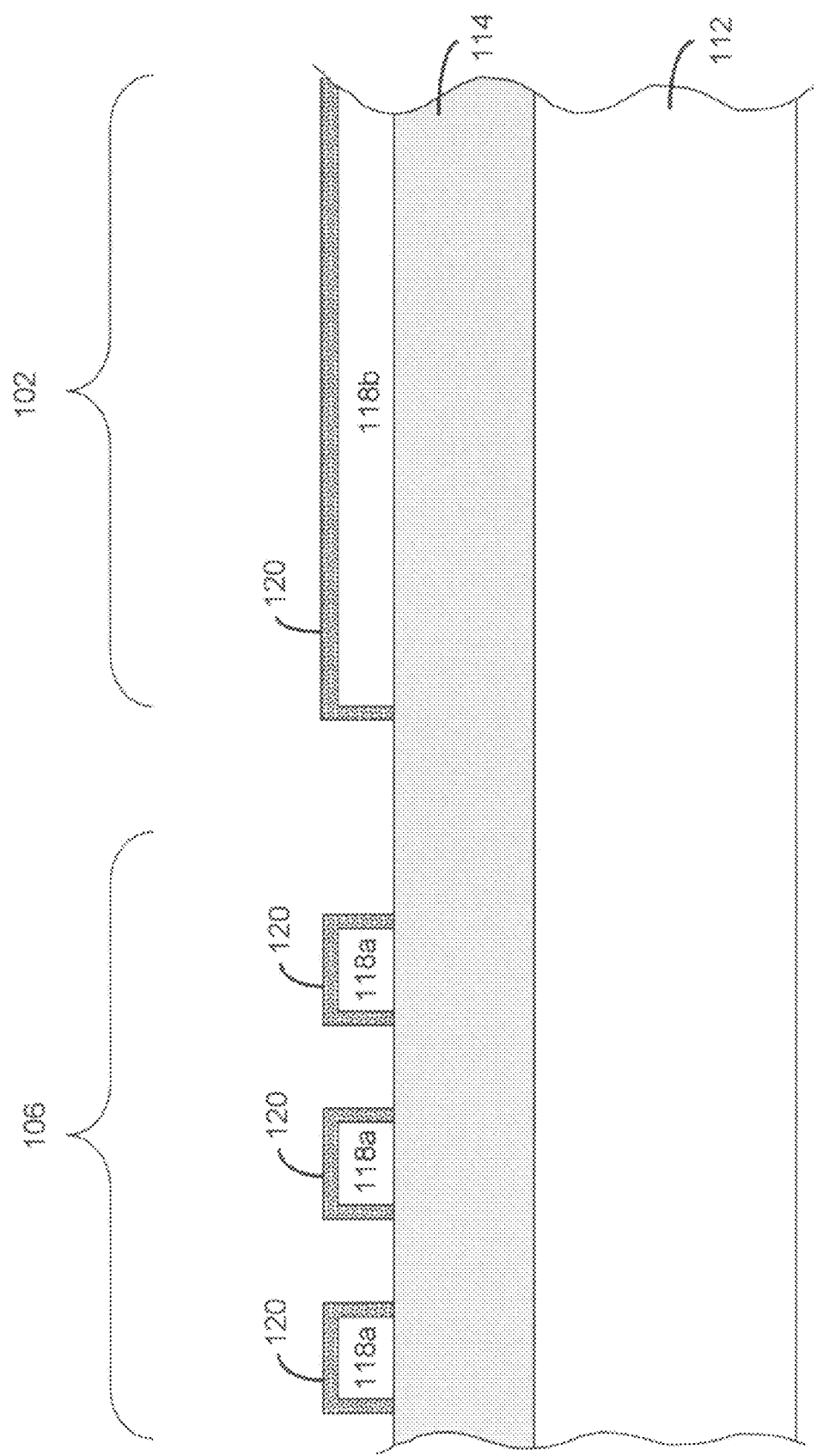

With reference to FIGS. 7 and 8, semiconductor layer 116 may be patterned (using conventional lithographic and etching techniques) to generally define memory section 102 and logic section 106. In this regard, semiconductor layer 116 is patterned to provide semiconductor segments 118a that will be employed as the active areas of the transistors (for example, the source, drain and body of the transistors) of logic section 106 (see, FIG. 7). In addition, in this embodiment, semiconductor section 118b remains generally unpatterned. Thereafter, dielectric layer 120 (for example, silicon oxide, silicon nitride or combinations thereof, such as an oxide-nitride-oxide material) may be deposited, formed and/or grown on semiconductor segments 118a and semiconductor section 118b (see, FIG. 8).

Notably, in one embodiment, the deposition, formation and/or growth of the dielectric material is selective. In another embodiment, a layer of dielectric is deposited, formed and/or grown in a non-selective manner and that layer is later patterned using conventional lithographic and etching techniques.

Figure 9:
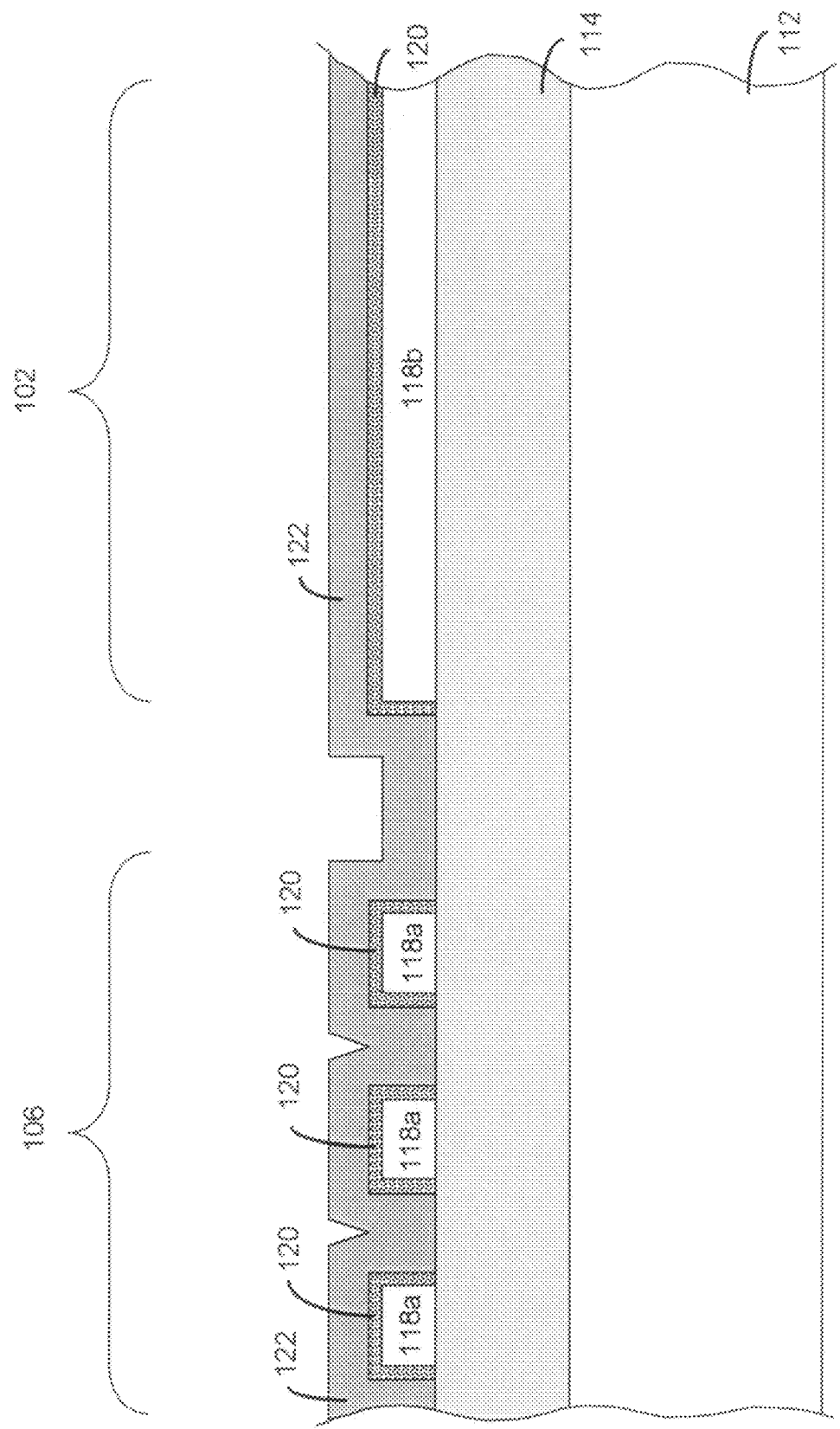
Figure 10:
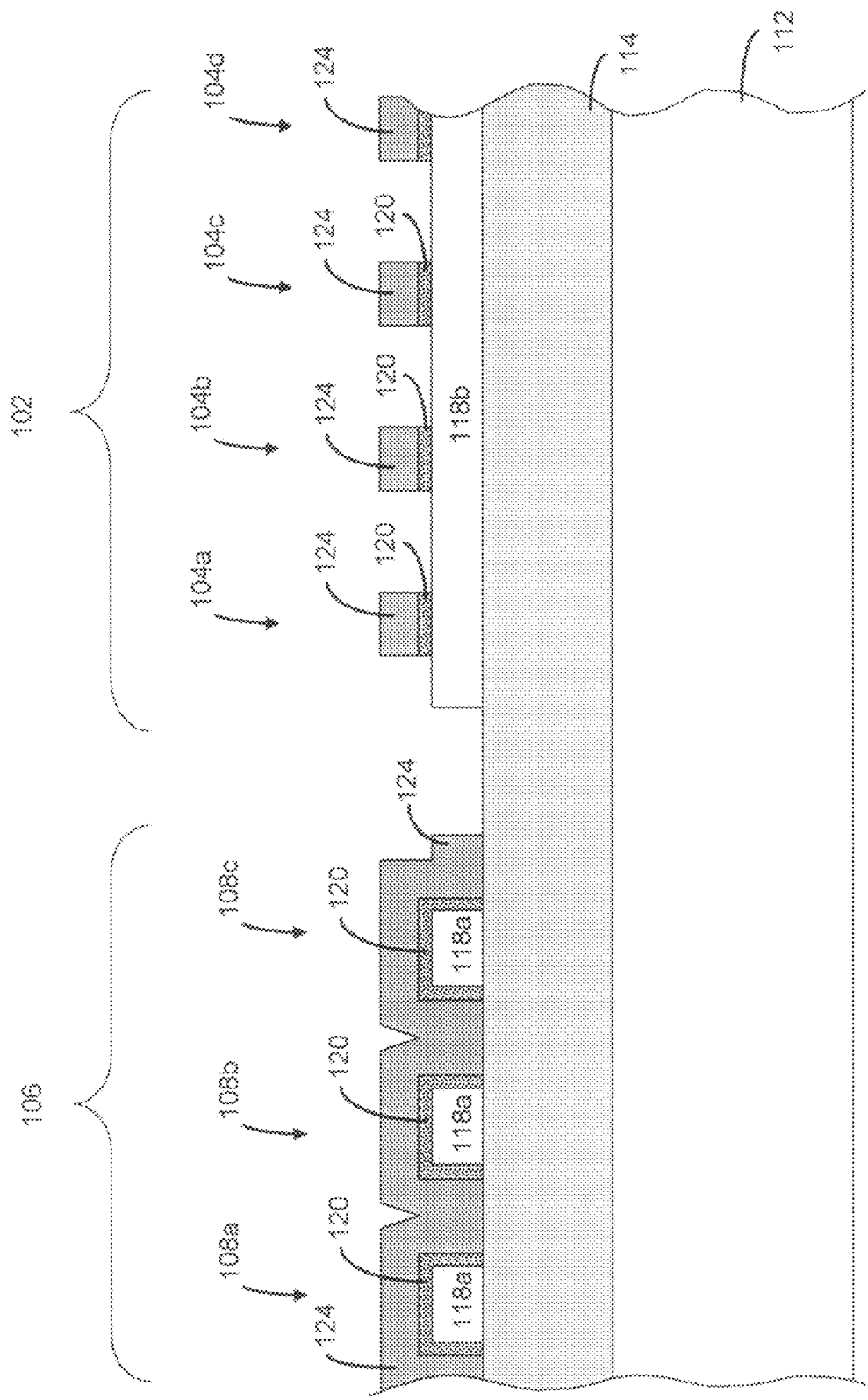

With reference to FIGS. 9 and 10, highly conductive layer 122 (comprised of, for example, heavily doped silicon, germanium, gallium arsenide, metal or metal compound) may then be deposited on dielectric layer 120 (see, FIG. 9). The highly conductive layer 122 may then be patterned to form gates 124 of transistors 108a-c and memory cells 104a-d (see, FIG. 10) and transistors 108a-b and/or memory cells 104a-d (see, for example, FIGS. 11A and 11B).

Notably, dielectric material 120 disposed on semiconductor segment 118b may be patterned before and/or after deposition, formation and/or patterning of highly conductive layer 122.

Figure 11A:
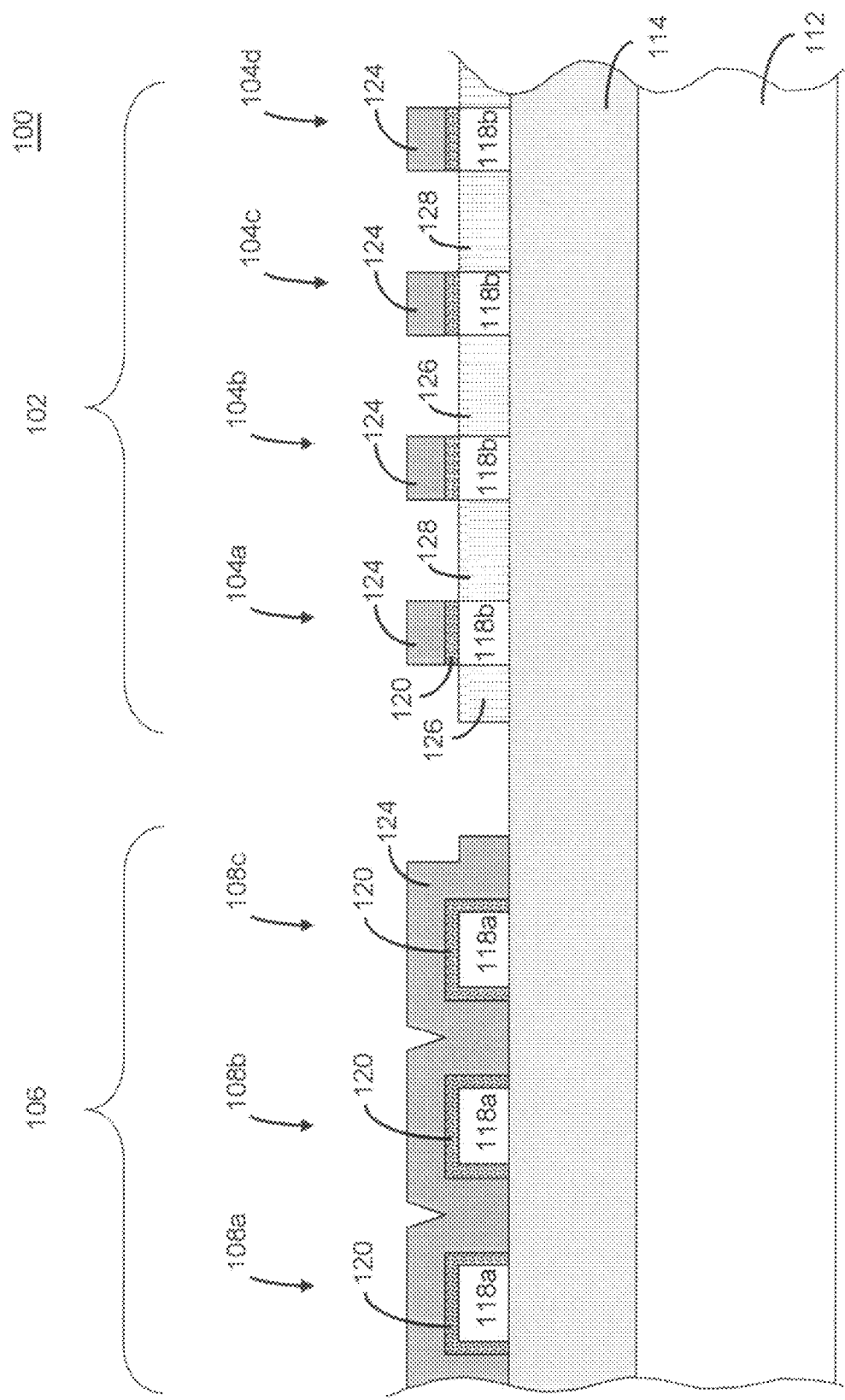
Figure 11B:
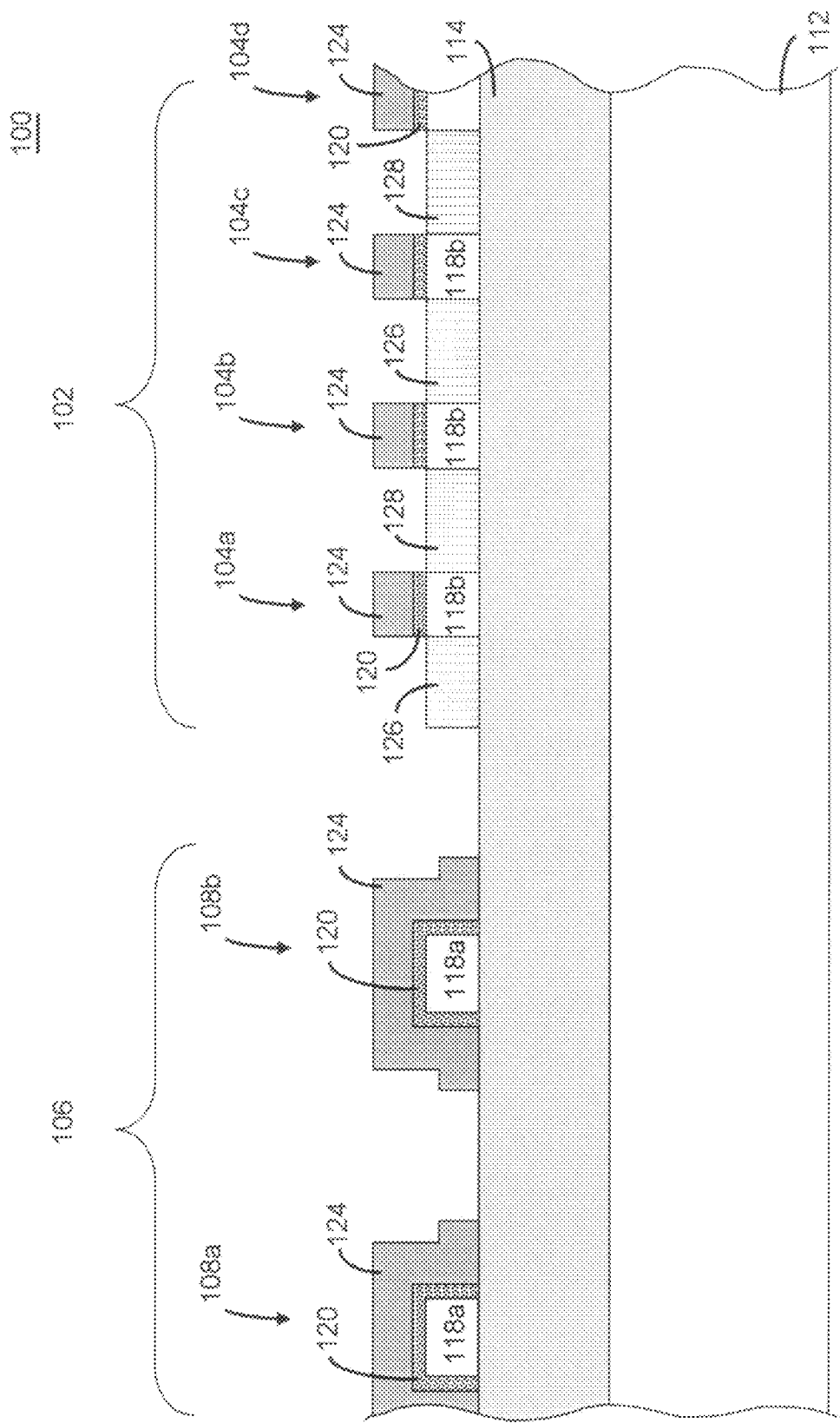
FIG. 11B illustrates cross-sectional view of the fabrication of the integrated circuit of FIG. 5B at a stage of an exemplary process, according to certain aspects of the present invention.

Thereafter, in one embodiment, the source regions 126 and drain regions 128 of memory cells 104 and transistors 108 may be formed using conventional techniques (for example, via ion implantation) using the associated gate as a mask (see, FIGS. 11A and 11B). In another embodiment, source and drain implants may be performed before deposition and formation of gates 124. Indeed, the source and/or drain regions 126 and 128 (respectively) may be performed at other (earlier and/or later) steps in the fabrication process flow.

Notably, gates 124 of the transistors of memory cells 104 and gates 124 of transistors 108 may be interconnected in various ways in order to provide a predetermined circuit configuration, function or operation. For example, in one embodiment, selected or predetermined gates 124 of transistors 108 may be connected to provide a particular circuit, function or operation. (See, FIG. 11A).

The fabrication process of integrated circuit device 100 may continue with the backend processing, including, for example, transistor interconnection, contact formation, passivating material deposition, and packaging (if any).

In another embodiment of the present invention, integrated circuit device 100 includes memory section 102 including memory cells 104 having transistor dimensions that provide, maximize and/or enhance the "memory effect". In this regard, logic section 106 may include high performance transistors 108 having dimensions that minimize, reduce and/or eliminate "memory effect" to increase the speed and/or predictability of the transistors in logic section 106. In contrast, memory cells 104 may include transistor dimensions that provide, maximize and/or increase the "memory effect" to, for example, provide suitable and/or enhance the data retention characteristics of the transistors of memory cells 104.

In one embodiment, changes in the "memory effect" may be implemented using greater different impurity doping levels of silicon segments or pieces in or near the body region of (i) the transistor of memory cells 104 and (ii) transistors 108 of logic section 106. In this regard, as described and illustrated in application Ser. No. 10/487,157, which was filed by Fazan et al. on Feb. 18, 2004 and entitled "Semiconductor Device" (hereinafter the "Semiconductor Memory Device Patent Application II"), the impurity doping levels of the silicon segments or pieces in or near the body region of the transistor of memory cells 104 may be greater than the impurity doping levels of the silicon segments or pieces in or near the body region of transistors 108 of logic section 106. Notably, the entire contents of the Semiconductor Device Patent Application II, including, for example, the inventions, features, attributes, architectures, configurations, materials, techniques and advantages described and illustrated therein, are hereby incorporated by reference herein.

In another embodiment, an additional buried impurity region may be incorporated within memory section 102 and/or memory cells 104 as, for example, described and illustrated in the Semiconductor Device Patent Application II. Again, those discussions are incorporated by reference herein in their entirety.

In yet another embodiment, differing characteristics may be obtained by employing different widths of the silicon segment of memory cells 104 and transistors 108. In this way, the transistors of memory cells 104 (i.e., the FinFET or multi gate transistors in memory section 102) may behave more like typical PD or FD transistors. (See, for example, FIG. 12). Notably, all techniques to increase, enhance and/or maximize the "memory effect" of the transistors of memory section 102 (relative to transistors 108 of logic section 106), whether now known or later developed, are intended to come within the scope of the present invention.

Figure 12:
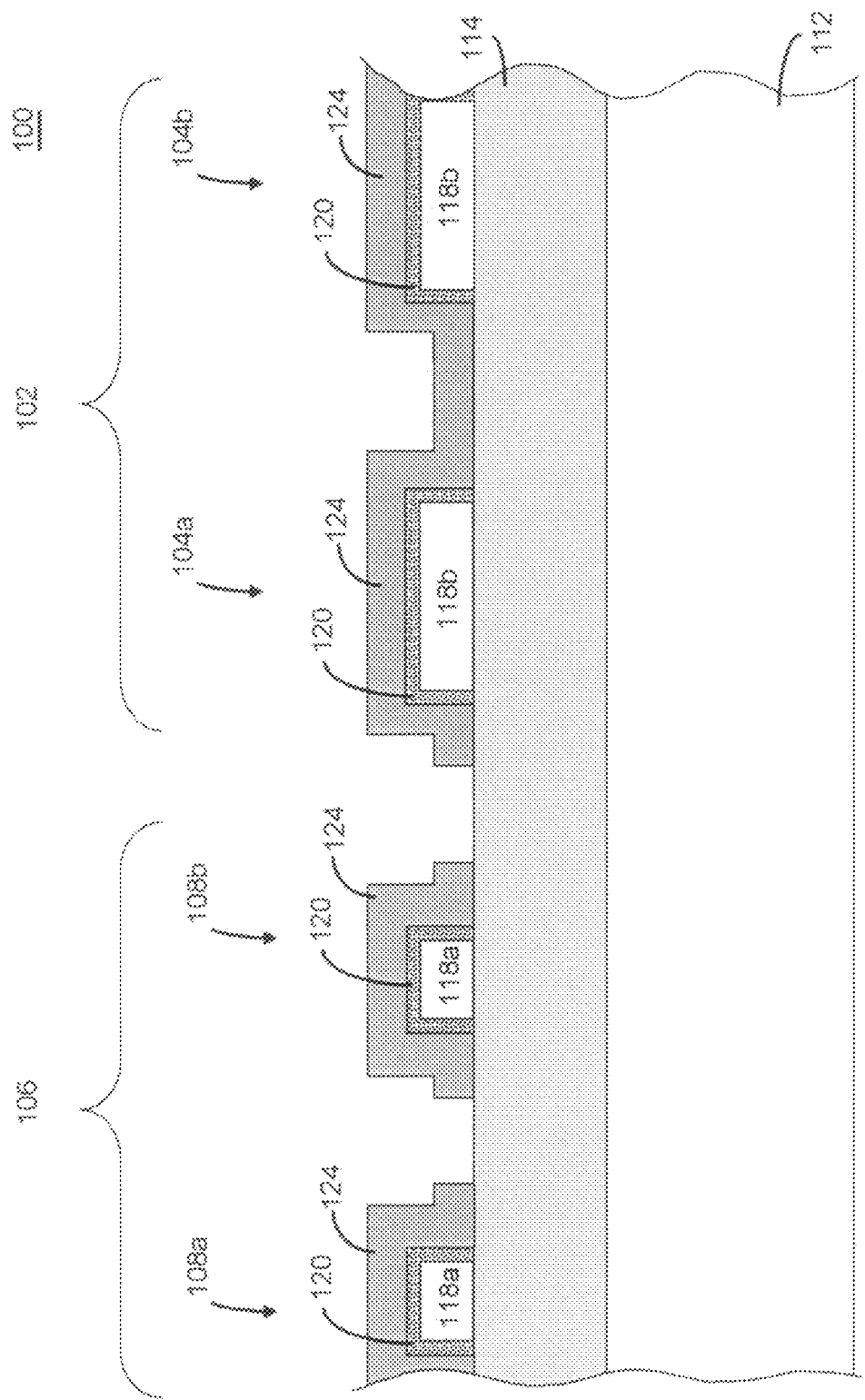
FIG. 12 illustrates an integrated circuit device including a memory section having, for example, PD or FD SOI memory cells, and a logic section having, for example, high performance transistors, such as Fin-FET, multiple gate transistors, and/or non-high performance transistors, according to certain embodiments of another aspect of the present invention.
Figure 13:
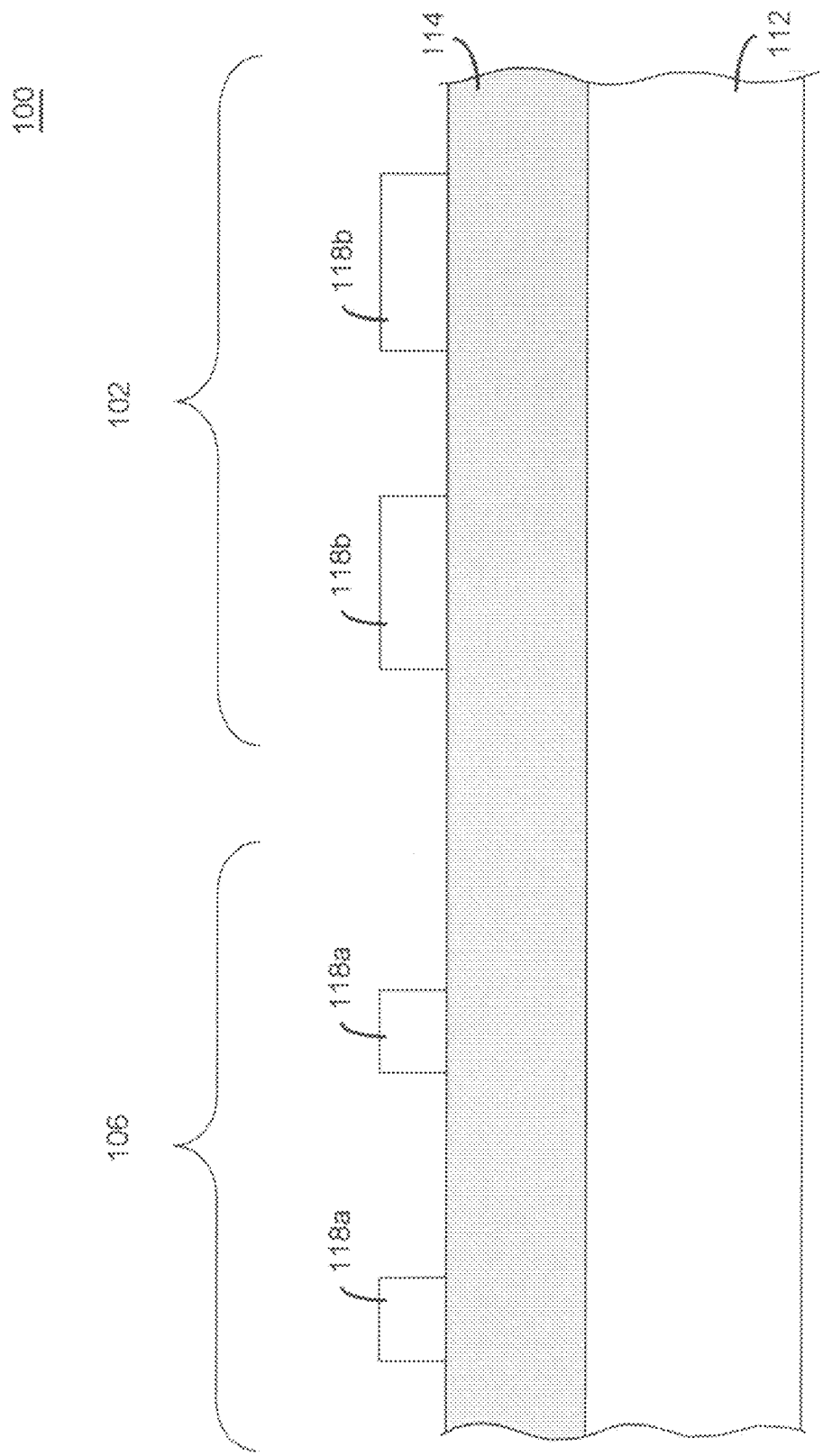
FIGS. 13-16 illustrate cross-sectional views of the fabrication of the integrated circuit of FIG. 12 at various stages of an exemplary process, according to certain aspects of the present invention.
Figure 14:
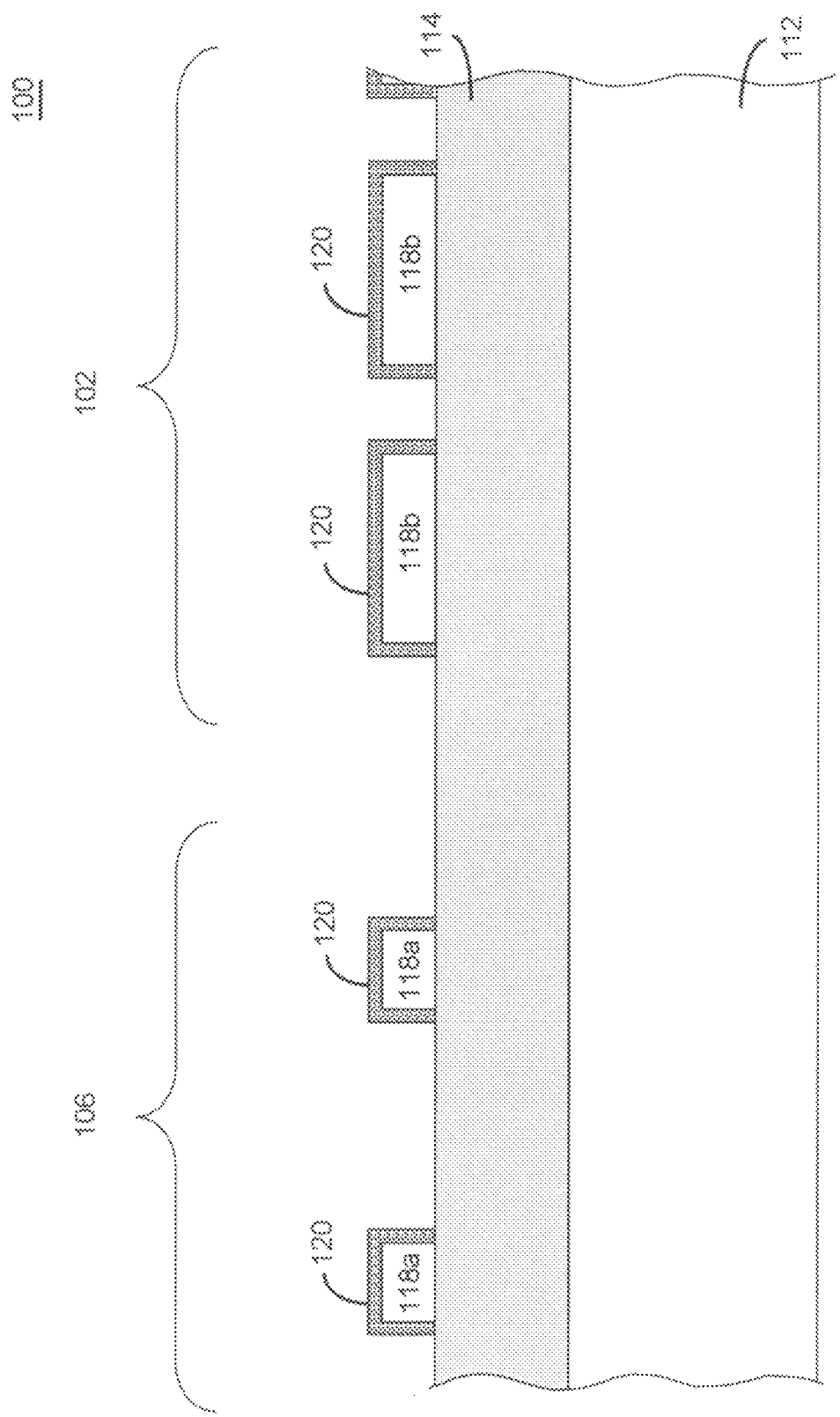

An exemplary method of fabricating or manufacturing an integrated circuit according to the embodiment illustrated in FIG. 12 may begin with an SOI wafer. (See, for example, FIG. 6). Thereafter, semiconductor layer 116 may be patterned (using conventional lithographic and etching techniques), to provide memory section 102, including semiconductor segments or pieces 118b, that will be employed as the active areas (for example, the source, drain and body of the transistors) of the transistors of memory cells 104 (see, FIG. 13). The logic section 106 includes semiconductor segments 118a having width that is less than the channel width of the transistors of memory cells 104 (for example, less than the width of semiconductor segments 118b which are patterned and etched in memory section 102 of integrated circuit device 100). A dielectric layer (comprised of, for example, silicon oxide, silicon nitride or combinations thereof, such as an oxide-nitride-oxide) may then be deposited, formed and/or grown on semiconductor segments 118 (see, FIG. 14).

Figure 1A:
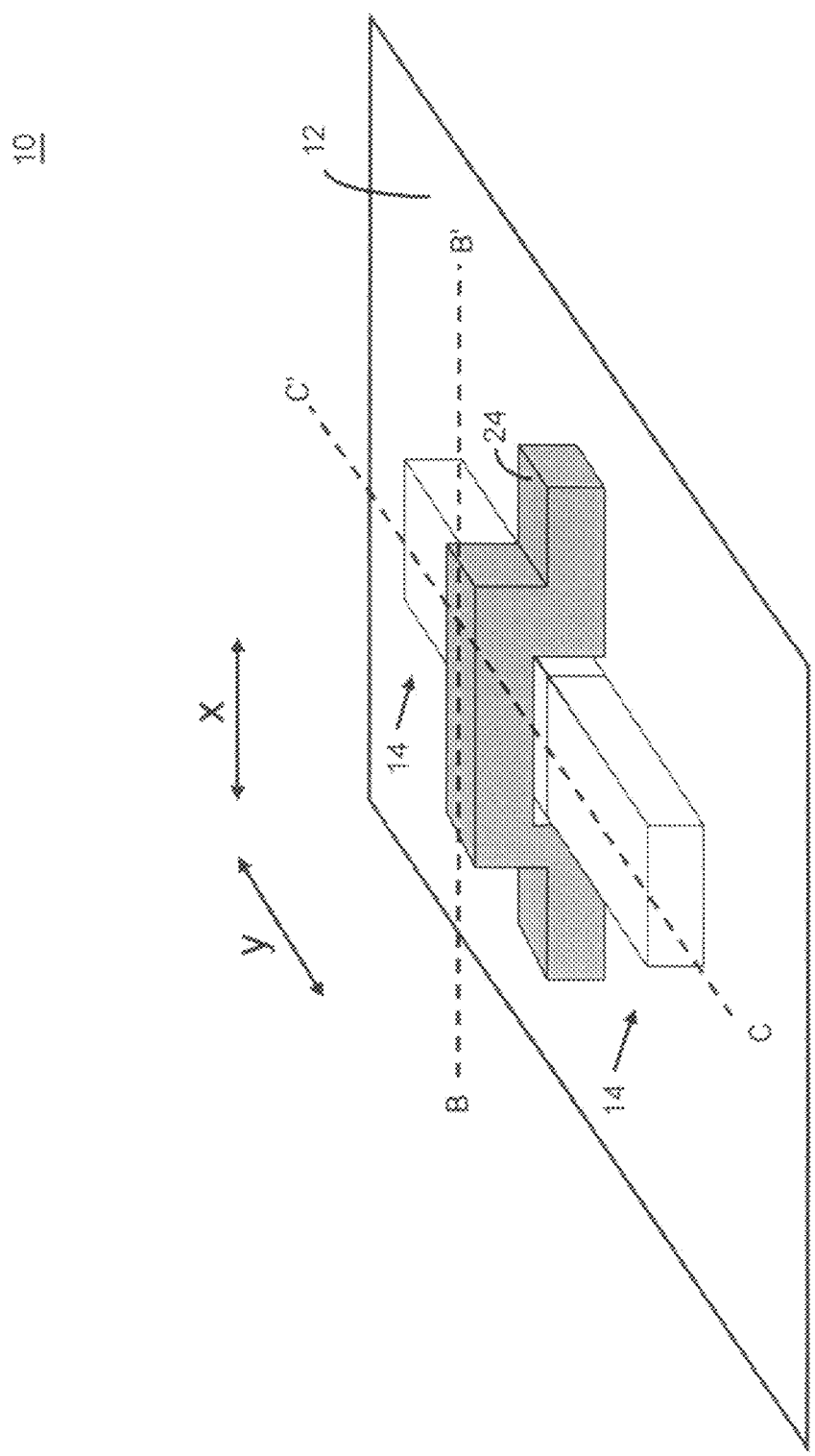
FIG. 1A illustrates a three dimensional view of Fin-FET or multiple gate SOI transistor.
Figure 1B:
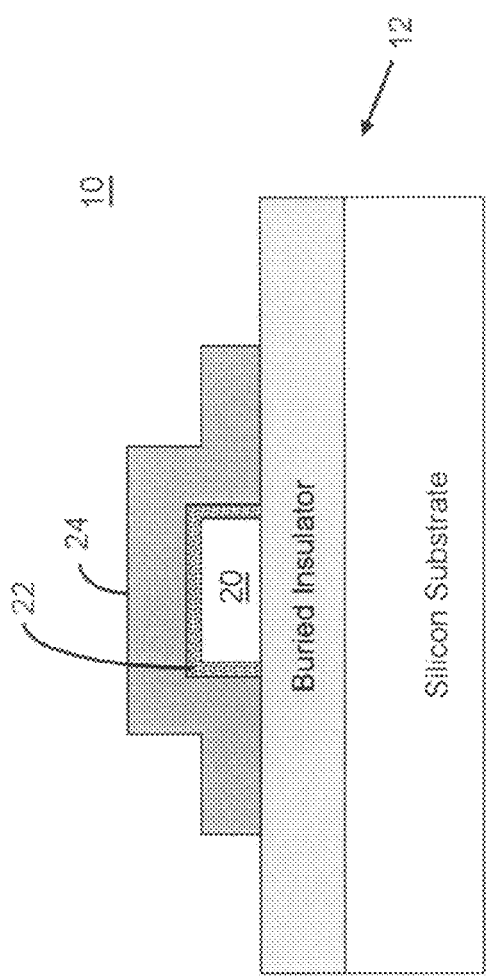
FIGS. 1B and 1C illustrate cross-sectional views of a semiconductor transistor as illustrated in FIG. 1A, sectioned along lines B-B' and C-C', respectively.
Figure 1C:
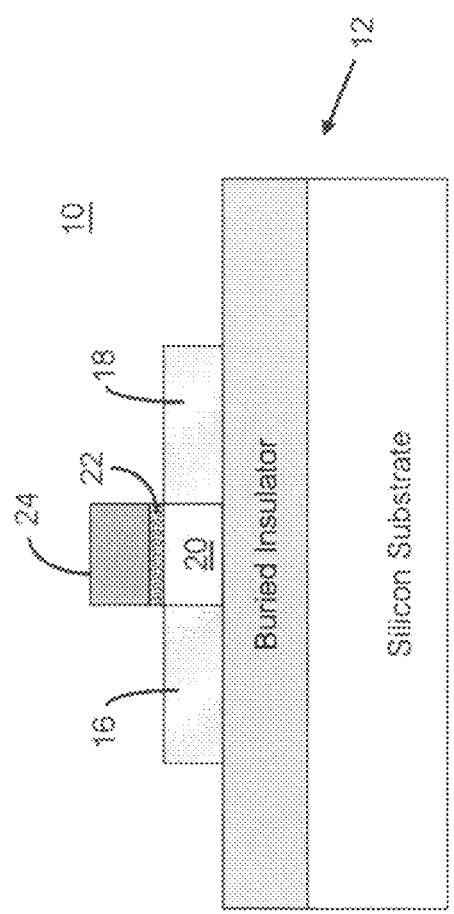
Figure 2A:
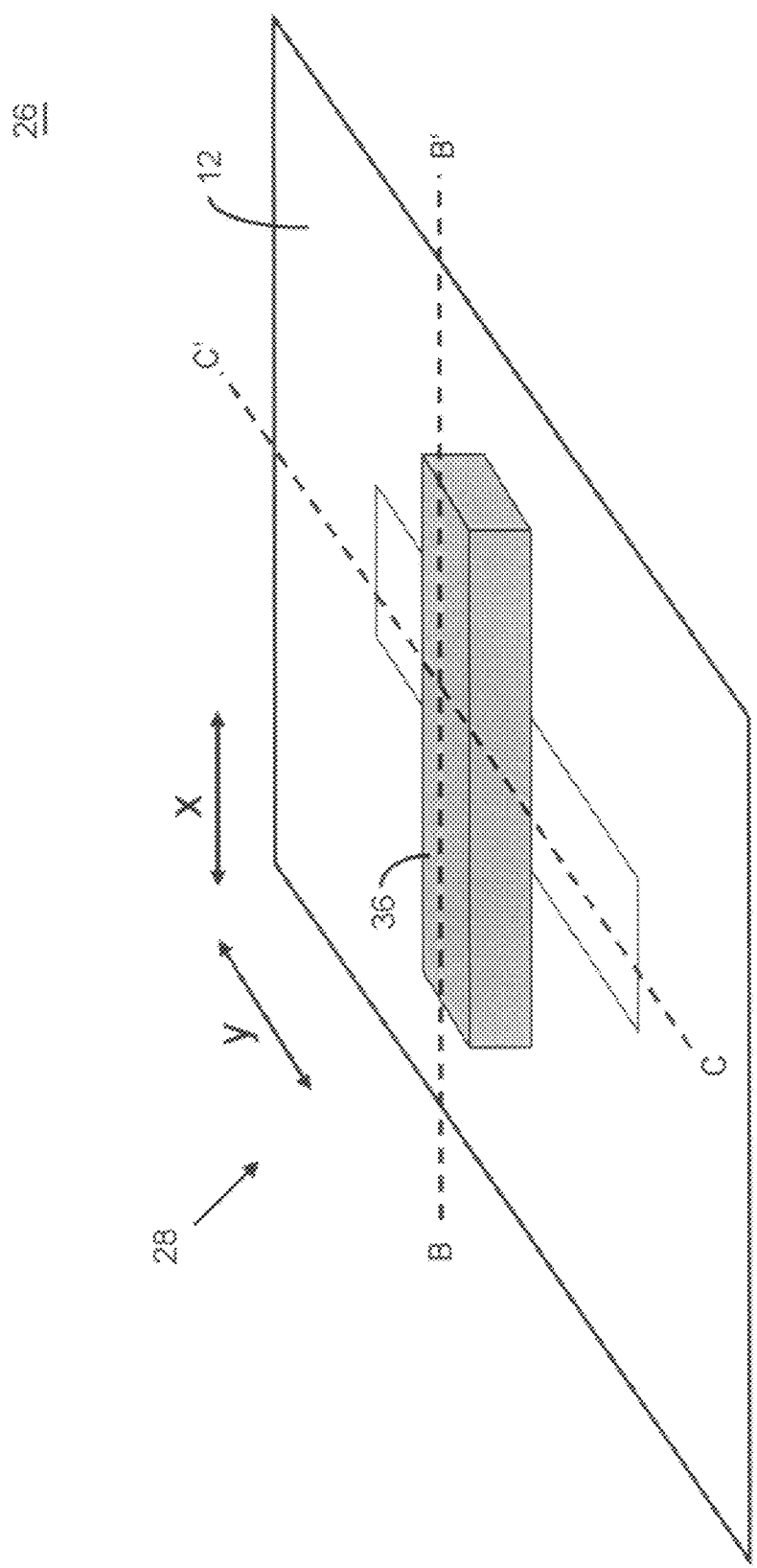
FIG. 2A illustrates a three dimensional view of one embodiment of a semiconductor transistor as illustrated (and described) in the Semiconductor Memory Device Patent Application.
Figure 2B:
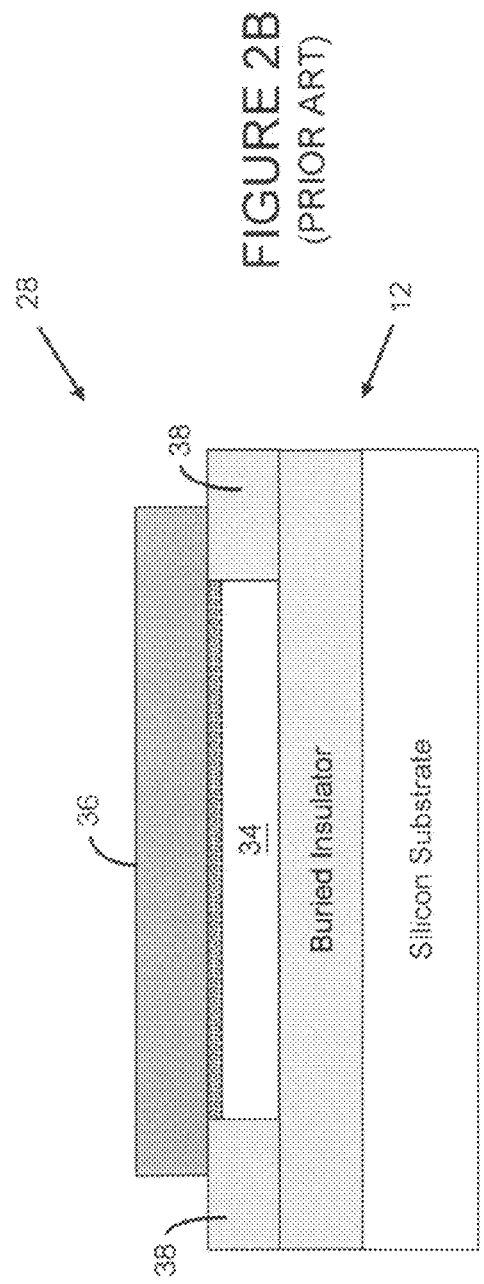
FIGS. 2B and 2C illustrate cross-sectional views of a semiconductor transistor as illustrated in FIG. 2A, sectioned along lines B-B' and C-C', respectively.
Figure 2C:
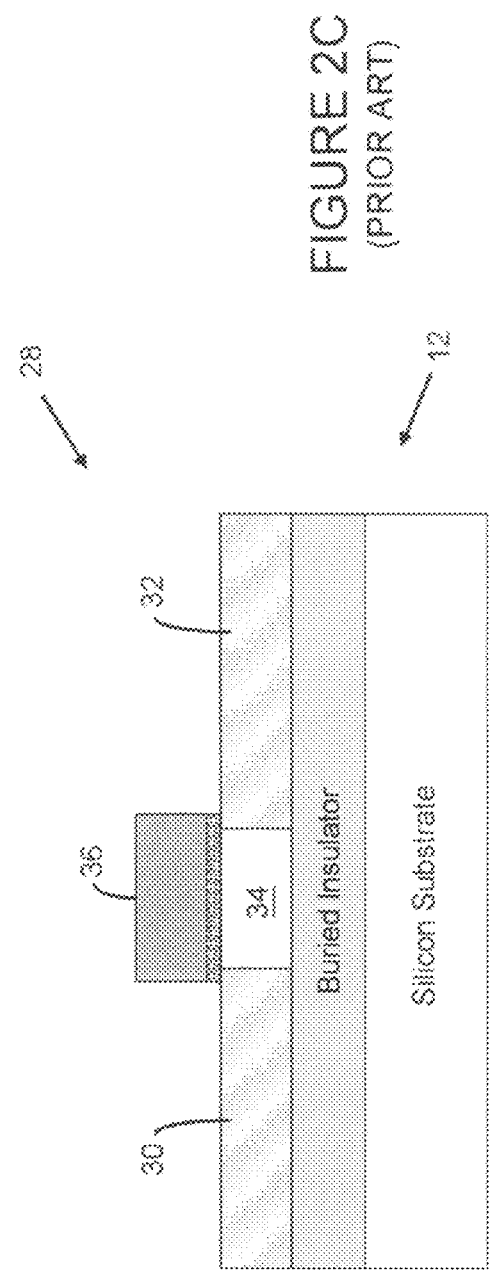
Figure 3A:
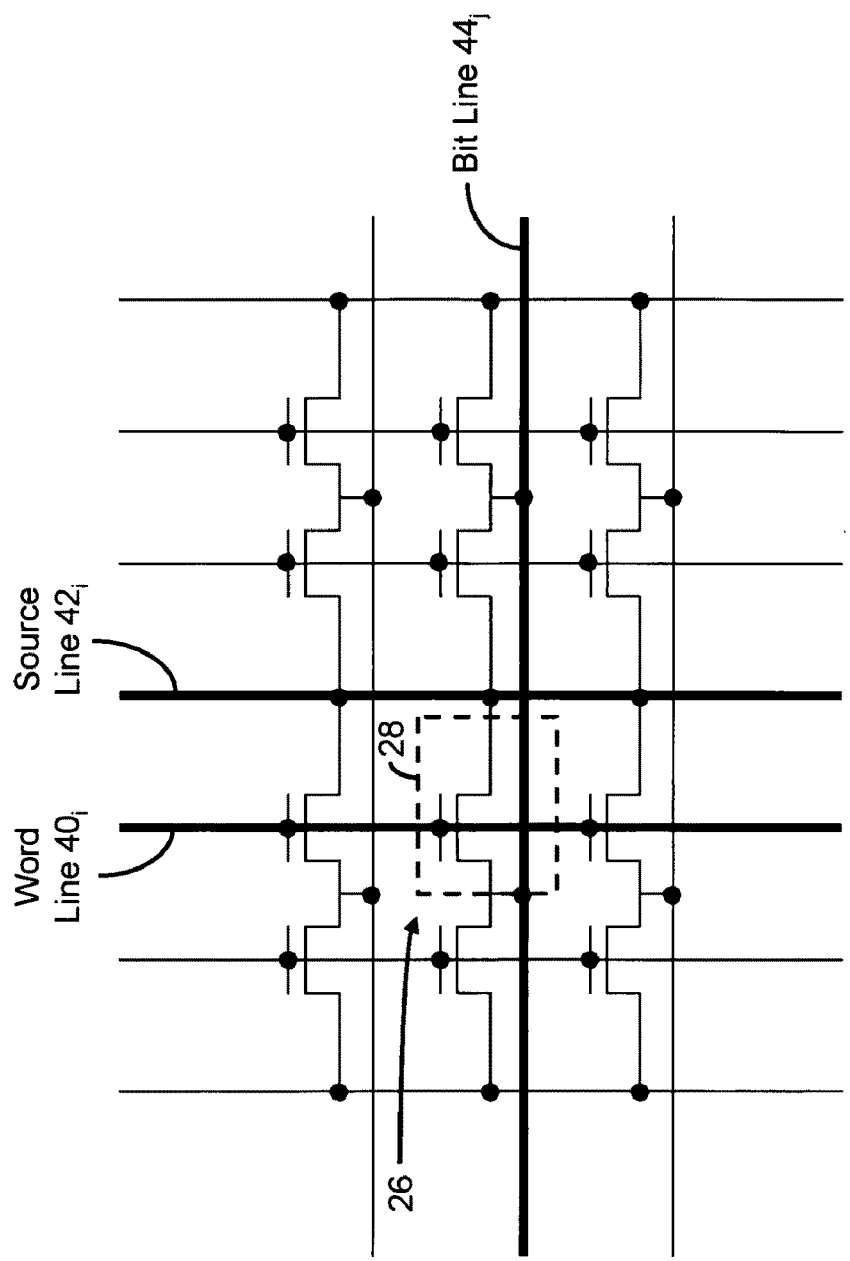
FIG. 3A is a schematic representation of a portion of a DRAM array as illustrated (and described) in one embodiment of the Semiconductor Memory Device Patent Application.
Figure 5A:
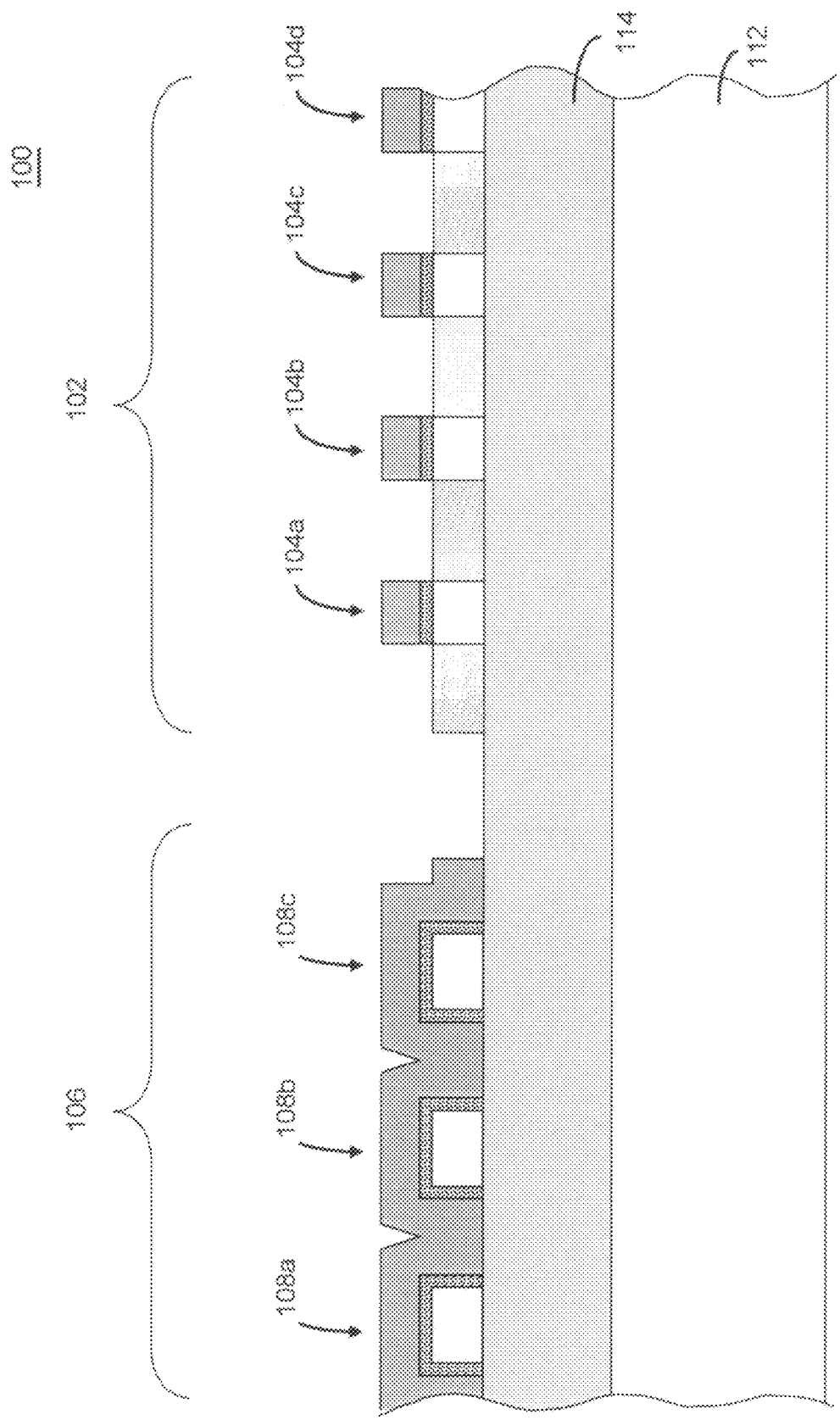
FIGS. 5A and 5B illustrate an integrated circuit device including a memory section having, for example, PD or FD SOI memory cells, and a logic section having, for example, high performance transistors, such as Fin-FET, multiple gate transistors, and/or non-high performance transistors, according to certain embodiments of certain aspects of the present inventions.
Figure 5B:
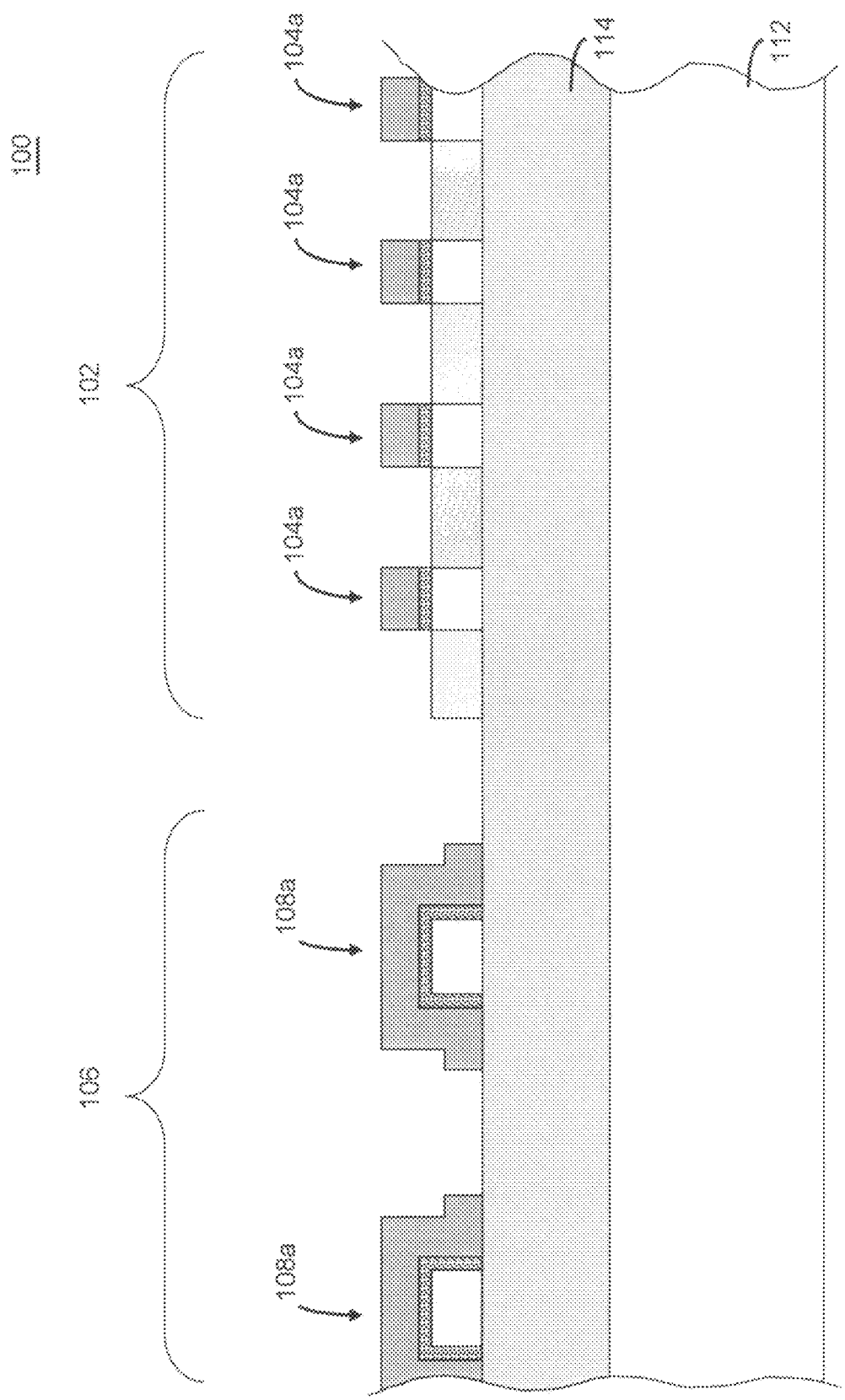

Notably, all of the embodiments, features, attributes and advantages of the inventions described and illustrated with respect to FIGS. 5A and 5B may be implemented in the embodiment of FIG. 12. For the sake of brevity, those discussions will not be repeated in detail.

Figure 15:
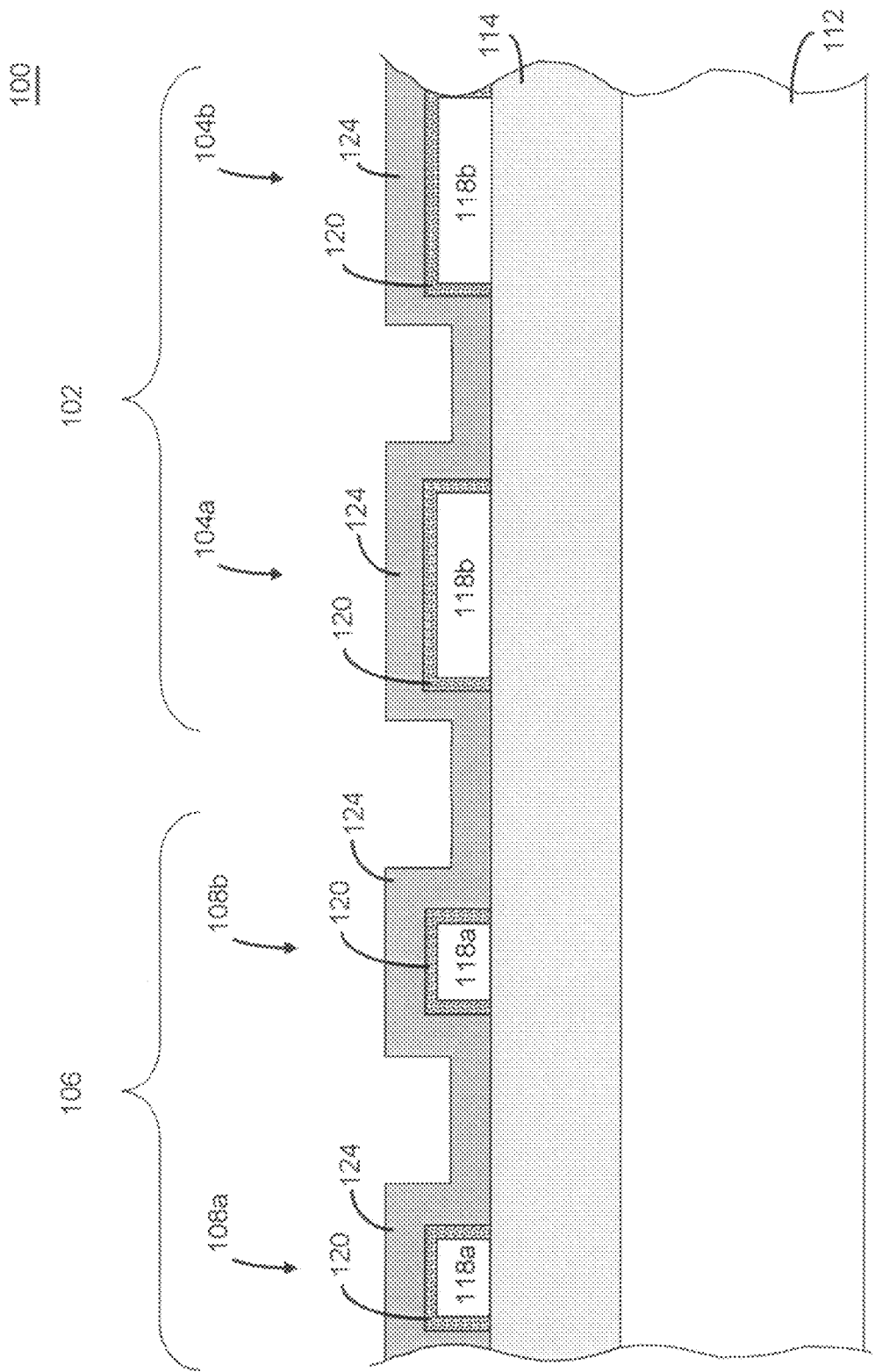

After deposition of the dielectric layer, a highly conductive material (for example, a layer of heavily doped silicon, germanium, gallium arsenide, metal or metal compound, or combinations thereof) may be deposited and/or formed on the dielectric material (see, FIG. 15). The highly conductive material may be patterned to provide gates 124 of the transistors of memory cells 104 as well as gates 124 of transistors 108 (see, for example, FIG. 12).

Figure 16:
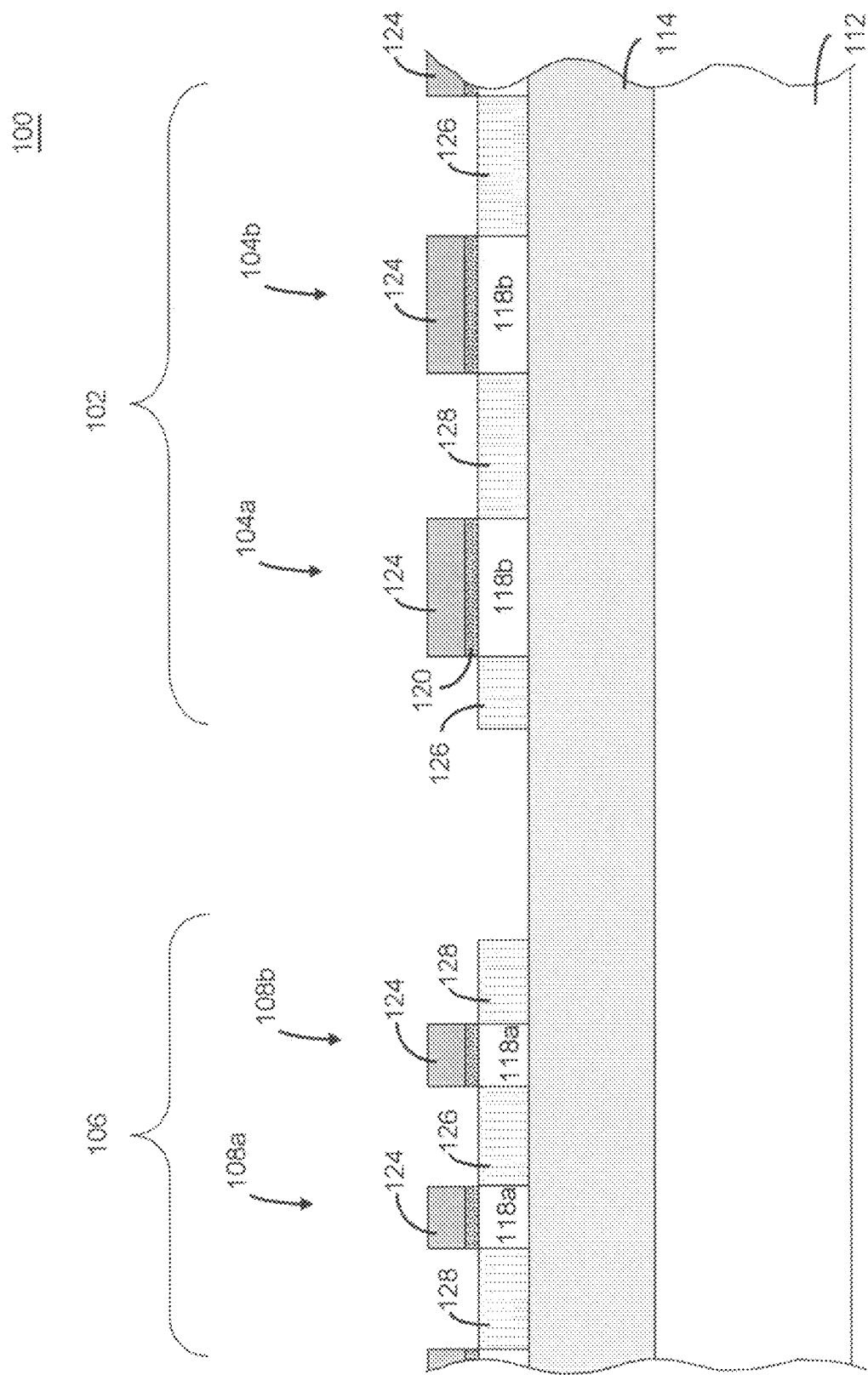

As described above with respect to the embodiments of FIGS. 5A and 5B, in one embodiment, the source regions and drain regions are formed via ion implantation using the gate of the transistors as a mask (see, for example, FIG. 16). In another embodiment, source and drain regions are performed before deposition and formation of the gates of the transistors. Indeed, the source/drain regions may be performed at other steps in the process.

Figure 17A:
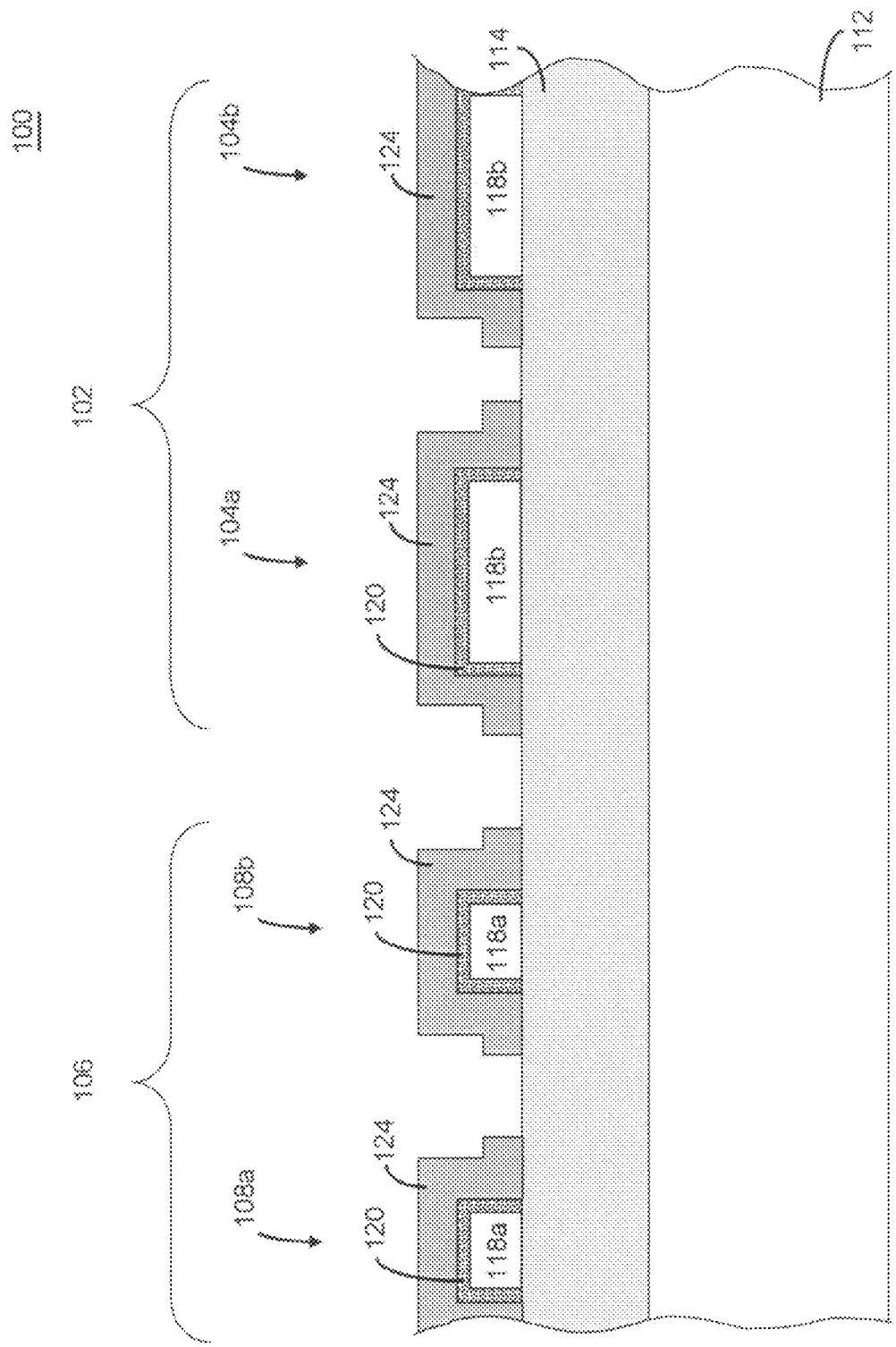
FIGS. 17A-17C illustrate an integrated circuit device including a memory section having, for example, PD or FD SOI memory cells, and a logic section having, for example, high and/or non-high performance transistors, according to other embodiments of the present invention.
Figure 17B:
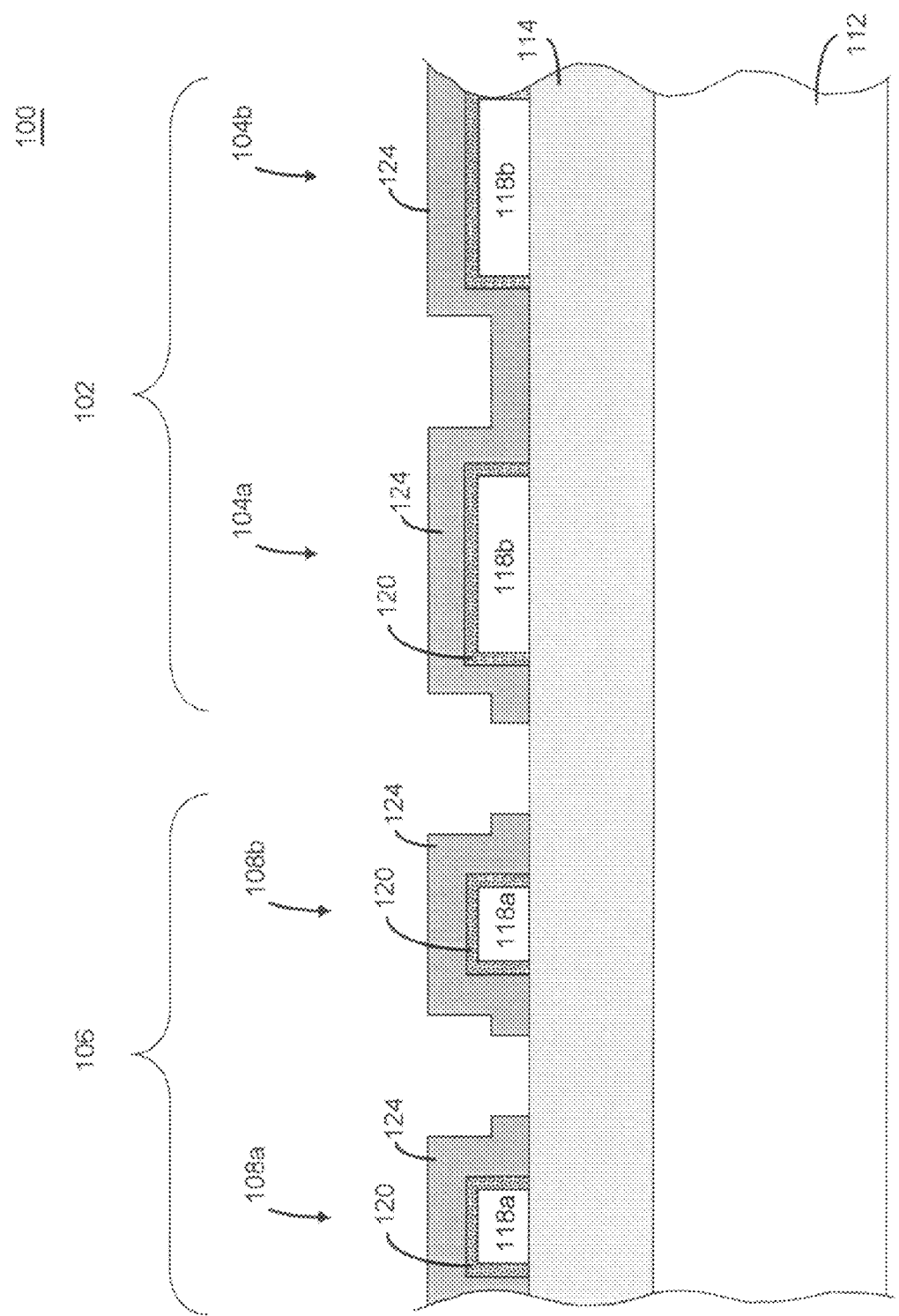
Figure 17C:
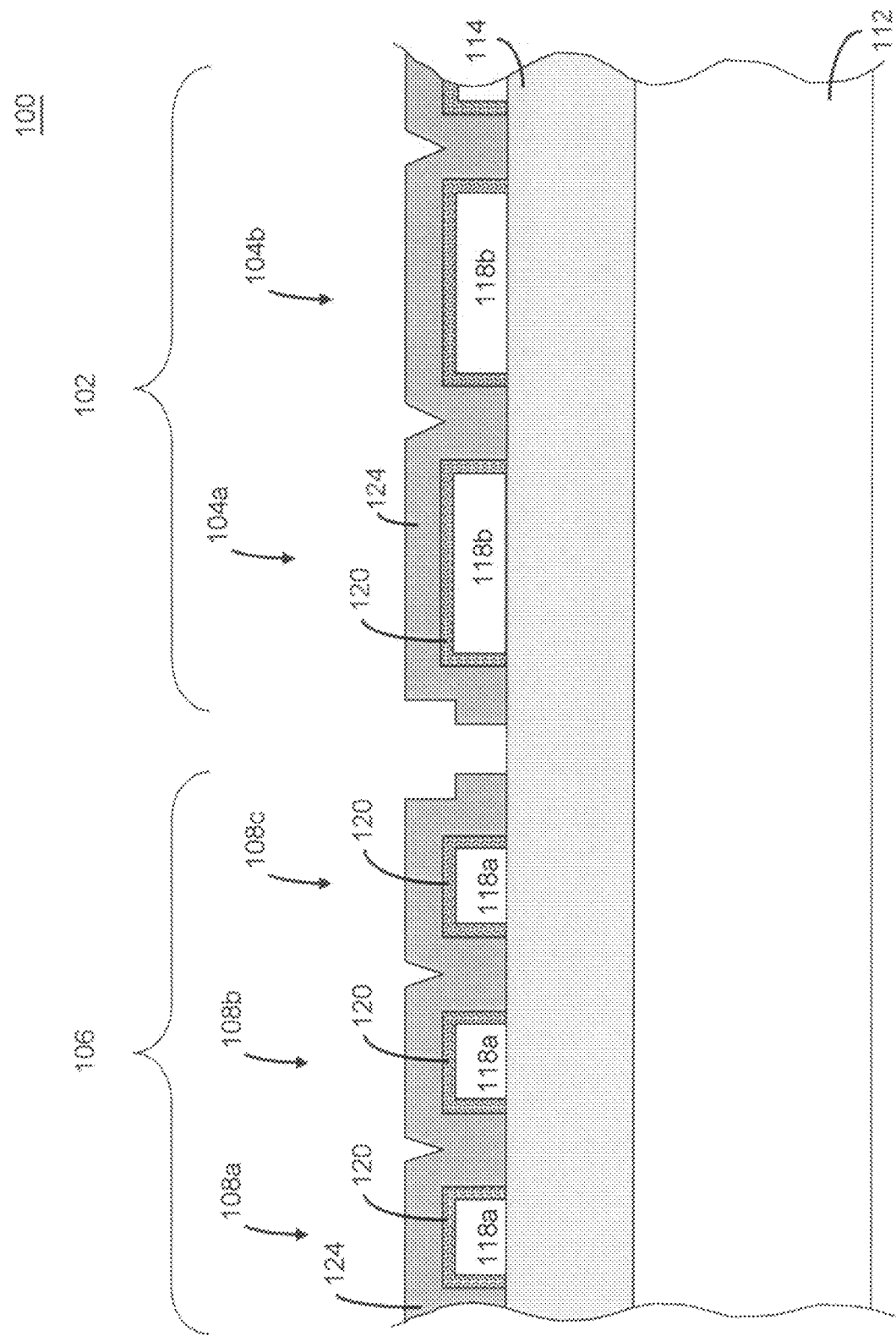

Notably, as mentioned above, gates 124 of the transistors of memory cells 104 and gates 124 of transistors 108 of logic section 106 may be interconnected in various ways in order to provide a predetermined circuit configuration, function or operation. (See, FIGS. 17A-17C). For example, in one embodiment, selected or predetermined gates 124 of transistors 108 may be connected to provide a particular circuit, function or operation. (See, FIG. 17C).

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

For example, SOI wafer 12 may include a top or device layer of, for example, silicon (as described above), germanium, silicon/germanium, and gallium arsenide or any other semiconductor material, whether now known or later developed, in which transistors may be formed. All such materials are intended to fall within the scope of the present invention.

In addition, SOI wafer 12 may be prepared and/or fabricated using a number of conventional techniques. For example, SOI wafer 12 may be a SIMOX wafer fabricated using well-known techniques including those disclosed, mentioned or referenced in U.S. Pat. Nos. 5,053,627; 5,080, 730; 5,196,355; 5,288,650; 6,248,642; 6,417,078; 6,423,975;

and 6,433,342 and U.S. Published Patent Applications 2002/0081824 and 2002/0123211, the contents of which are hereby incorporated by reference. Notably, all types, materials and/or fabrication techniques of or for SOI wafers, whether now known or later developed, are intended to fall within the scope of the present invention.

The memory cell(s) 104 may also employ the structure, features, attributes, architectures, configurations, materials, techniques and advantages described and illustrated in the following non-provisional U.S. patent applications:

(1) application Ser. No. 10/450,238, which was filed by Fazan et al. on Jun. 10, 2003 and entitled "Semiconductor Device";

(2) application Ser. No. 10/487,157, which was filed by Fazan et al. on Feb. 18, 2004 and entitled "Semiconductor Device";

(3) application Ser. No. 10/829,877, which was filed by Ferrant et al. on Apr. 22, 2004 and entitled "Semiconductor Memory Cell, Array, Architecture and Device, and Method of Operating Same"; and (4) application Ser. No. 10/840,009, which was filed by Ferrant et al. on May 6, 2004 and entitled "Semiconductor Memory Device and Method of Operating Same". For the sake of brevity, such discussion, in conjunction with the inventions described herein, will not be repeated here. Rather, the entire contents of these non-provisional U.S. patent applications, including, for example, the inventions, features, attributes, architectures, configurations, materials, techniques and advantages described and illustrated therein, are hereby incorporated by reference herein.

Moreover, the memory cells may be arranged, configured and/or controlled using any of the memory cell arrays, architectures and/or control/operation techniques described and illustrated in the above-referenced four (4) non-provisional U.S. patent applications. For the sake of brevity, those discussions will not be repeated; such memory cell arrays, architectures and/or control/operation techniques are incorporated herein by reference.

The inventions (and embodiments thereof) described and illustrated herein are entirely applicable to N-channel and/or P-channel transistors. Moreover, while the discussion described and illustrated only source and drain implants, other implants may also be included. For example, implants to modify the operation of memory cells 104, which affect, for example, the power consumption of memory cells 104 as described and illustrated in (1) application Ser. No. 10/450, 238, which was filed on Jun. 10, 2003 and entitled "Semiconductor Device"; (2) application Ser. No. 10/487,157, which was filed on Feb. 18, 2004 and entitled "Semiconductor Device".

In addition, it should be noted that the sensor described and illustrated in the Semiconductor Memory Device Patent Application (for example, FIG. 18 of the Semiconductor Memory Device Patent Application) may also be implemented in the present invention. In this regard, that sensor may be integrated with logic and/or memory cells/transistors, of the type described above (for example, the high performance and non-high performance transistors).

The fabrication techniques and flow described and illustrated herein are exemplary embodiments. It is to be understood that other embodiments may be employed, including changes and additions of those described and illustrated, without departing from the scope of the present invention. For example, the transistors of the logic and/or memory sections may include "halo" implants and threshold adjust implants to, for example, enhance or optimize the performance of the transistors.

The description and illustrations of the present inventions have been presented for the purposes of examples. They are not intended to be exhaustive or to limit the inventions to the precise forms, techniques, materials and/or configurations disclosed. Many modifications and variations are possible in light of the above teaching. It is intended that the scope of the invention not be limited to this detailed description but be measured by the claims, which follow.

What is claimed is:

1. A method of manufacturing an integrated circuit device on or from an SOI wafer having a semiconductor layer disposed on an insulating layer, wherein the integrated circuit device includes a logic section, including a plurality of transistors, and a memory section, including a plurality of memory cells wherein each memory cell comprises a transistor and wherein the plurality of transistors of the logic section and the transistor of each memory cell of the memory section include body regions, the method comprising:

forming a plurality of semiconductor pieces in or from the semiconductor layer of the SOI wafer associated with the logic section, wherein each semiconductor piece includes a plurality of surfaces;

forming a plurality of semiconductor pieces in or from the semiconductor layer of the SOI wafer associated with the memory section, wherein each semiconductor piece includes a plurality of surfaces;

providing a dielectric material on the plurality of surfaces of the semiconductor pieces of the SOI wafer associated with the memory and logic sections;

providing a conductive material above the dielectric material;

doping the body regions of the transistors of the logic section with impurities;

doping the body region of the transistor of each memory cell of the memory section with the impurities; wherein impurity doping levels in the body regions of the transistors of the logic section are different from impurity doping levels in the body region of the transistor of each memory cell of the memory section:

providing a plurality of gates and associated gate dielectrics of each transistor of the memory cells of the memory section and each transistor of the logic section from the conductive material and the dielectric material, respectively; and providing source and drain regions of each transistor of the memory cells of the memory section and the transistors of the logic section in the respective semiconductor pieces of the SOI wafer.

2. The method of claim 1 wherein providing the source and drain regions of the transistors of the memory cells of the memory section furhter included providing the source and drain regions of the transistors in the semiconductor pieces of the SOI wafer associated with the memory section via ion implantation.

3. The method of claim 1 wherein providing the source and drain regions of the transistors in the logic section further includes providing the source and drain regions of the transistors in the semiconductor pieces of the SOI wafer associated with the logic section via ion implantation.

4. The method of claim 1 wherein providing a plurality of gates includes providing the plurality of gates such that the width of the gates of each transistor of the plurality of transistors of the logic section is less than the width of the gate of each transistor of each memory cell of the memory section.

5. The method of claim 1 wherein the semiconductor pieces comprise silicon, germanium or gallium arsenide.

6. The method of claim 1 wherein providing source and drain regions of the transistors of the memory cells of the memory section in the semiconductor pieces of the SOI wafer associated with the memory section includes forming the source and drain regions of the transistors of the memory cells of the memory section in the semiconductor pieces associated with the memory section via ion implantation of impurities after forming the plurality of semiconductor pieces in or from the semiconductor layer of the SOI wafer associated with the memory section.

7. The method of claim 6 wherein forming the source and drain regions of the transistors of the memory cells of the memory section in the semiconductor pieces associated with the memory section via ion implantation further includes implanting impurities in regions of semiconductor pieces associated with the memory section using the gates of the transistors of the memory cells of the memory section as masks.

8. The method of claim 1 wherein providing source and drain regions of the transistors of the logic section in the semiconductor pieces of the SOI wafer associated with the logic section includes implantinq impurities in regions of the semiconductor pieces associated with the logic section after forming the plurality of semiconductor pieces in or from the semiconductor layer of the SOl wafer associated with the logic section .

9. The method of claim 8 wherein implanting impurities in regions of the semiconductor pieces associated with the logic section further includes implanting impurities in regions of semiconductor pieces associated with the logic section using the gates of the transistors of the logic section as masks.

10. The method of claim 1 wherein the plurality of gates are comprised of a heavily doped silicon, germanium, gallium arsenide, metal or metal compound.

11. The method of claim 1 wherein the gate dielectrics are comprised of a silicon oxide or a silicon nitride.

12. The method of claim 11 wherein the silicon oxide or silicon nitride is an oxide-nitride-oxide material.

13. The method of claim 1 wherein providing a dielectric material on the plurality of surfaces of the semiconductor pieces of the SOI wafer associated with the memory and logic sections includes depositing, forming and/or growing the dielectric material on the plurality of surfaces of the semiconductor pieces of the SOI wafer associated with the memory and logic sections.

14. The method of claim 1 wherein:
doping the body regions of the transistors of the logic section with impurities includes doping the plurality of semiconductor pieces with the impurities in regions thereof corresponding to the body regions of the transistors of the logic section after forming the plurality of semiconductor pieces in or from the semiconductor layer of the SOI wafer associated with the memory section;
doping the body region of the transistor of each memory cell of the memory section with the impurities includes doping the plurality of semiconductor pieces with the impurities in regions thereof corresponding to the body region of the transistor of each memo cell of the memory section of impurities after forming the plurality of semiconductor pieces in or from the semiconductor layer of the SOI wafer associated with the memory section.

15. The method of claim 14 wherein the impurity doping levels of the plurality of semiconductor pieces in regions thereof associated with the body region of the transistor of each memory cell of the memory section are greater than the impurity doping levels of the plurality of semiconductor pieces in regions thereof associated with the body regions of the transistors of the logic section.

16. The method of claim 1 wherein doping the body regions of the transistors of the logic section and the body region of the transistor of each memory cell of the memory section with impurities includes doping with impurities which provide N-channel transistors.

17. The method of claim 1 wherein doping the body regions of the transistors of the logic section and the body region of the transistor of each memory cell of the memory section with impurities includes doping with impurities which provide P-channel transistors.

* * * * *